US007057226B2

(12) United States Patent
Lee

(10) Patent No.: US 7,057,226 B2
(45) Date of Patent: Jun. 6, 2006

(54) SEMICONDUCTOR DEVICE AND METHOD OF FABRICATING THE SAME

(75) Inventor: Woon-Kyung Lee, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 354 days.

(21) Appl. No.: 10/170,393

(22) Filed: Jun. 14, 2002

(65) Prior Publication Data

US 2002/0190312 A1 Dec. 19, 2002

(30) Foreign Application Priority Data

Jun. 14, 2001 (KR) ................ 2001-33549

(51) Int. Cl.
*H01L 29/76* (2006.01)

(52) U.S. Cl. ................ 257/314; 257/501
(58) Field of Classification Search ............ 257/324, 257/315, 314, 501
See application file for complete search history.

(56) References Cited

U.S. PATENT DOCUMENTS

| 4,825,271 | A | * | 4/1989 | Tanaka et al. | 257/316 |
| 5,643,813 | A | * | 7/1997 | Acocella et al. | 438/593 |
| 5,918,125 | A | * | 6/1999 | Guo et al. | 438/264 |
| 6,166,410 | A | * | 12/2000 | Lin et al. | 257/324 |
| 6,590,255 | B1 | * | 7/2003 | Ichige et al. | 257/315 |
| 6,791,142 | B1 | * | 9/2004 | Tseng | 257/316 |
| 6,794,708 | B1 | * | 9/2004 | Mori | 257/314 |

* cited by examiner

*Primary Examiner*—W. David Coleman
(74) *Attorney, Agent, or Firm*—Lee & Morse, P.C.

(57) ABSTRACT

The present invention provides a semiconductor device in which the gate is self-aligned to the device isolation film and a fabricating method thereof. A device isolation film restricting an active region is disposed on a portion of a semiconductor substrate, and a word line is across over the device isolation film. A gate pattern is disposed between the word line and the active region, and a tunnel oxide film is disposed between the gate pattern and the active region. The gate pattern comprises a floating gate pattern, a gate interlayer dielectric film pattern and a control gate electrode pattern deposited in the respective order, and has a sidewall self-aligned to the device isolation film. To form the gate pattern having the sidewall self-aligned to the device isolation film, a gate insulation film and a gate material film are formed in the respective order on the semiconductor substrate.

15 Claims, 24 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the present invention relates to a non-volatile memory device having a floating gate or a floating carrier trap and a method of fabricating the same.

2. Description of Related Art

As shown in FIG. 1 and FIG. 2, a conventional non-volatile memory cell having a floating gate includes a gate pattern comprised of a floating gate 110a, a gate interlayer dielectric film 118, and a control gate electrode 116 deposited in the stated order. Device isolation films 102 are located in portions of a semiconductor substrate to restrict and define active regions 109. The control gate electrode 116 and the gate interlayer dielectric film 118 extend and cross over the device isolation film 102 and are in contact with adjacent memory cells. The floating gate 110a is disposed between the control gate electrode 116 and the active region 109, and a tunnel oxide film 104 is disposed between the floating gate 110a and the active region 109. An impurity diffusion layer 120 is located in the active region in-between control gate electrodes 116. A sidewall spacer 122 may be added to a sidewall of the gate pattern.

As shown in FIG. 2, the floating gate 110a of the conventional non-volatile memory device is comprised of a lower floating gate 106a self-aligned to the device isolation film 102 and an upper floating gate 108a on the lower floating gate 106a. The upper floating gate 108a is extended over or overlapped with the device isolation film 102. This overlapping is meant for enlarging the area of the gate interlayer dielectric film 118 that is disposed between the upper floating gate 108a and the control gate electrode 116 in order to improve a coupling ratio of the non-volatile memory device. However, when the upper floating gate 108a overlaps with the device isolation film 102, while the coupling ratio may be improved, it also leads to a problem in which the cell array area is increased in order to guarantee the spacing in-between the upper floating gates 108a. This also leads to several problems associated with the fabrication processes.

FIGS. 3 to 5 illustrate cross-sectional views of a conventional non-volatile memory device having a floating gate, taken along a direction I–I' of FIG. 1, showing a conventional process.

Referring to FIG. 3, device isolation films 102 restricting a plurality of active regions 109 are formed on portions of a semiconductor substrate 100, and a tunnel oxide film 104 and a lower conductive film pattern 106 are deposited, respectively, in an active region in-between the device isolation films 102. The device isolation films 102 and the lower conductive film pattern 106 are formed conventionally by using a self-aligned trench isolation technology.

Referring to FIG. 4, an upper conductive film pattern 108 is formed on the lower conductive film pattern 106. As a result, a floating gate pattern 110 comprised of the lower conductive film pattern 106 and the upper conductive film pattern 108 is formed in the active region 109. Edges of the upper conductive film pattern 108 are overlapped with the device isolation film 102, and sidewalls of the upper conductive film pattern 108 are formed with a slope. Next, a gate interlayer dielectric film 112 is conformably formed over the entire surface of the semiconductor substrate 100, and then a gate conductive film 114 is formed over the gate interlayer dielectric film 112.

Referring to FIG. 5, a control gate electrode 116 is formed across the device isolation film 102 and a floating gate 110a in a self-aligned fashion, by sequentially patterning the gate conductive film 114, the gate interlayer dielectric film 112, and the floating gate pattern 110, including the tunnel oxide film 104. A gate interlayer dielectric film pattern 118 is disposed between the floating gate 110a and the control gate electrode 116. In the above step, the sloped sidewalls of the floating gate pattern 110 that overlap with the device isolation film 102 reduce the etching burden at the time the gate interlayer dielectric film 112 is etched. Thus, there is a limit in minimizing the cell area because additional space is required to form the sloped sidewalls of the floating gate pattern 110. Also, there is a problem in that a coupling ratio of the cell may be varied according to a configuration of the floating gate pattern 110.

SUMMARY OF THE INVENTION

According to a feature of an embodiment of the present invention, there is provided a non-volatile memory device having a floating gate which is not overlapped but is self-aligned to a device isolation film. Therefore, the width of the device isolation film can be reduced, and a uniform coupling ratio may be obtained as well.

According to another feature of an embodiment of the present invention, a floating carrier trap type non-volatile memory device and a method of fabricating a MOS transistor having a gate electrode self-aligned to the device isolation film are provided.

According to another aspect of an embodiment of the present invention, there is provided a semiconductor device having a device isolation film arranged on at least a portion of a semiconductor substrate and restricting an active region; a word line crossing over the active region; a gate pattern disposed between the word line and the active region; and a tunnel oxide film disposed between the gate pattern and the active region, wherein the gate pattern is self-aligned to the device isolation film so that the gate pattern and the device isolation film contact each other.

The gate pattern includes a floating gate pattern, a gate interlayer dielectric film pattern and a control gate electrode pattern disposed in the stated order in-between the tunnel oxide film and the word line with the word line making a contact with the control gate electrode.

According to another aspect of an embodiment of the present invention, there is provided a method of fabricating a semiconductor device, comprising forming a device isolation film restricting an active region on at least a portion of a semiconductor substrate with a gate pattern self-aligned to the device isolation film; and forming a conductive film pattern crossing over the gate pattern and the device isolation film, wherein the conductive film pattern is in contact with the gate pattern.

The step for forming the device isolation film and the gate pattern includes forming a gate insulation film and a gate material film, in the stated order, on the semiconductor substrate; forming a gate line by patterning the gate material film and the gate insulation film, in the stated order; forming an impurity diffusion layer in the semiconductor substrate at both sides of the gate line; forming a trench crossing the gate line by pattering the gate line, the gate insulation film and the semiconductor substrate, in the stated order; and then simultaneously forming the gate pattern having a first sidewall self-aligned to the trench; and forming the device isolation film by filling the trench with an insulation film. Alternatively, the step for forming the device isolation film and the gate pattern includes forming a gate insulation film and a gate material film, in the stated order, on the semiconductor substrate; forming a trench restricting the active region on at least a portion of the semiconductor substrate by patterning the gate material film, the gate insulation film and the semiconductor substrate, in the stated order; forming the device isolation film by filling the trench with an insulation film; and forming the gate pattern having a sidewall self-aligned to the device isolation film by patterning the gate material film and the gate insulation film, in the stated order.

The step for forming the conductive film pattern includes forming an interlayer insulation film covering the entire surface of the semiconductor substrate on which the gate pattern is formed; forming a groove exposing an upper side of the gate pattern by patterning the interlayer insulation film; forming a conductive film filling the groove; and planarizing the conductive film so that the interlayer insulation film is exposed.

According to another aspect of an embodiment of the present invention, a method of fabricating a semiconductor device is provided, comprising forming a tunnel oxide film, a first conductive film, a gate interlayer dielectric film, a second conductive film, and a hard mask film, respectively, on a semiconductor substrate; forming a trench restricting an active region by patterning the hard mask film, the second conductive film, the gate interlayer dielectric film, the first conductive film, the tunnel oxide film, and the semiconductor substrate, respectively; forming a device isolation film by filling the trench with a first insulation material; removing the hard mask film; forming a gate pattern, which includes a control gate electrode pattern, a gate interlayer dielectric film pattern, and a floating gate pattern, respectively from top to the bottom, and also having a first sidewall self-aligned to the device isolation film on the active region, by patterning the second conductive film, the gate interlayer dielectric film, and the first conductive film including the tunnel oxide film, respectively; forming an interlayer insulation film by filling a gap area outside of the gate pattern with a second insulation material; and forming a word line crossing over the device isolation film and connected to the control gate electrode pattern.

The method described immediately above may further comprise forming an impurity diffusion layer in the active region outside of the gate pattern after the gate pattern is formed; forming a sacrifice spacer on a second sidewall of the gate pattern; forming a blocking oxide film on the active region outside of the gate pattern by performing a thermal oxidation process to the semiconductor substrate; removing the sacrifice spacer; forming a dielectric material film conformally over the entire surface of the semiconductor substrate; and forming a sidewall spacer on the second sidewall of the gate pattern covered with the dielectric material film, wherein both the sidewall spacer and the control gate electrode contact the word line.

In this method, the step for forming the word line may include forming a groove crossing over the device isolation film and exposing the control gate electrode by patterning the interlayer insulation film; forming a third conductive film filling the groove and covering the entire surface of the interlayer insulation film; and planarizing the third conductive film so that the interlayer insulation film is exposed.

According to another aspect of an embodiment of the present invention, a method of fabricating a semiconductor device is provided, comprising forming a tunnel oxide film, a first conductive film, a gate interlayer dielectric film, a second conductive film, and a hard mask film, respectively, on a semiconductor substrate; forming a trench restricting an active region by patterning the hard mask film, the second conductive film, the gate interlayer dielectric film, the first conductive film, the tunnel oxide film, and the semiconductor substrate, respectively; forming a device isolation film by filling the trench with a first insulation material; exposing the second conductive film by removing the hard mask film; forming a third conductive film over the entire surface of the semiconductor substrate on which the second conductive film is exposed; and forming a word line crossing over the device isolation film by patterning the third conductive film, the second conductive film, the gate interlayer dielectric film, and the first conductive film including the tunnel oxide film, respectively; and simultaneously forming a gate pattern self-aligned to the device isolation film on the active region, wherein the gate pattern includes a floating gate pattern, a gate interlayer dielectric film pattern and a control gate electrode pattern deposited in the stated order.

This method may further comprise forming an impurity diffusion layer in the active region outside of the gate pattern after the word line and the gate pattern are formed.

According to another aspect of an embodiment of the present invention, a method of fabricating a semiconductor device is provided, comprising forming a tunnel oxide film, a first conductive film, a gate interlayer dielectric film, and a second conductive film, in the stated order, on a semiconductor substrate; forming a gate line by patterning the second conductive film, the gate interlayer dielectric film and the first conductive film, including the tunnel oxide film, in the stated order; forming a trench restricting an active region by patterning the gate line including the tunnel oxide film, and the semiconductor substrate, in the stated order, and simultaneously forming a gate pattern isolated by the trench on the active region; forming an interlayer insulation film by filling gaps outside of the gate pattern including the trench with an insulation material; and forming a word line crossing over the trench and connected to the gate pattern, wherein the gate pattern includes a floating gate pattern, a gate interlayer dielectric film pattern, and a control gate electrode pattern, deposited in the stated order, and the word line is in contact with the control gate electrode.

In the method described immediately above, the step for forming the trench and the interlayer insulation film include, forming a first interlayer insulation film filling gaps outside of the gate line over the entire surface of the semiconductor substrate in which the gate line is formed; forming the trench restricting the active region by patterning the first interlayer insulation film, the gate line, the tunnel oxide film, and the semiconductor substrate, in the stated order, and simultaneously forming the gate pattern isolated by the trench on the active region; and forming a second interlayer insulation film covering the entire surface of the semiconductor substrate and filling the trench.

An alternative method for forming the trench and the interlayer insulation film include, forming a photo-resist over the entire surface of the semiconductor substrate on which the gate line is formed; forming a photo-resist pattern for creating the trench by patterning the photo-resist; forming the trench restricting the active region by using the photo-resist pattern as an etching mask and by patterning the gate line, the tunnel oxide film, and the semiconductor substrate, in the stated order, and simultaneously forming the gate pattern isolated by the trench on the active region; removing the photo-resist pattern; and forming the interlayer insulation film covering the entire surface of the semiconductor substrate and filling the trench.

This method may further comprise forming an impurity diffusion layer in the active region outside of the gate line after the gate line is formed and forming a sacrifice spacer on a sidewall of the gate line; forming a blocking oxide film on the active region outside of the gate line by performing a thermal oxidation process on the semiconductor substrate; exposing the sidewall of the gate line by removing the sacrifice spacer; forming a dielectric material film conformally over the entire surface of the semiconductor substrate; and forming a sidewall spacer on the sidewall of the gate line covered with the dielectric material film, wherein both the sidewall spacer and the control gate electrode pattern are in contact with the word line. In this method, the step for forming the word line may include, forming a groove crossing over the device isolation film and exposing an upper side of the gate pattern by patterning the interlayer insulation film; forming a third conductive film filling the groove over the entire surface of the interlayer insulation film; and planarizing the third conductive film so that the interlayer insulation film is exposed.

According to yet another aspect of an embodiment of the present invention, there is provided a method of fabricating a semiconductor device, comprising forming a gate insulation film and a gate conductive film, respectively, on a semiconductor substrate; forming a gate line by patterning the gate conductive film and the gate insulation film, in the stated order; forming an impurity diffusion layer in an active region outside of the gate line; forming a trench restricting the active region and crossing the gate line by patterning the gate line and the semiconductor substrate, in the stated order, and at the same time, forming a gate pattern isolated by the trench; forming an interlayer insulation film over the entire surface of the semiconductor substrate, on which the gate pattern is formed, filling the trench; and forming a word line crossing over the trench and connected to the gate pattern.

In the method described immediately above, the steps for forming the trench and the interlayer insulation film may include forming a first interlayer insulation film over the entire surface of the semiconductor substrate on which the gate line is formed; forming the trench restricting the active region by patterning the first interlayer insulation film, the gate line, and the semiconductor substrate, in the stated order, and simultaneously forming the gate pattern isolated by the trench on the active region; and forming a second interlayer insulation film filling the trench over the entire surface of the semiconductor substrate on which the gate pattern is formed.

Alternative steps for forming the trench and the interlayer insulation film may include, forming a photo-resist over the entire surface of the semiconductor substrate on which the gate line is formed; forming a photo-resist pattern for creating the trench by patterning the photo-resist; forming the trench restricting the active region by using the photo-resist pattern as an etching mask and by patterning the gate line and the semiconductor substrate, in the stated order, and simultaneously forming the gate pattern isolated by the trench on the active region; and forming the interlayer insulation film over the entire surface of the semiconductor substrate. In this method, the step for forming the word line includes, forming a groove crossing over the trench and exposing an upper side of the gate pattern by patterning the interlayer insulation film; forming a third conductive film filling the groove over the entire surface of the interlayer insulation film; and planarizing the third conductive film so that the interlayer insulation film is exposed.

This method further comprises forming an interlayer metal film conformally over the entire surface of the interlayer insulation film before the third conductive film is formed.

According to a feature of some of the embodiments of the present invention, the word line or the third conductive film may be formed using a polycide film or a metal film.

The word line or the third conductive film may also include an interlayer metal film.

The metal film is formed of a tungsten-based or a copper-based material, and the interlayer metal film may be formed of Ti or TiN material.

According to another feature of some of the embodiments of the present invention, the tunnel oxide film or the gate insulation film may be formed of a material selected from the group consisting of silicon oxide, and silicon oxy-nitride.

The gate interlayer dielectric film may be formed of silicon oxide-silicon nitride-silicon oxide (ONO).

The first insulation material and the material used for forming the interlayer insulation film may be silicon oxide.

The second insulation material may be silicon oxide. The hard mask film and the sacrificial sidewall spacers may be formed of silicon nitride.

According to yet another feature of some of the embodiments of the present invention, the first and second conductive film and the sidewall spacer conductive film may be formed of a poly-silicon material.

These and other features and aspects of the present invention will be readily apparent to those of ordinary skill in the art upon review of the detailed description that follows.

DETAILED DESCRIPTION OF THE INVENTION

Figure 1:
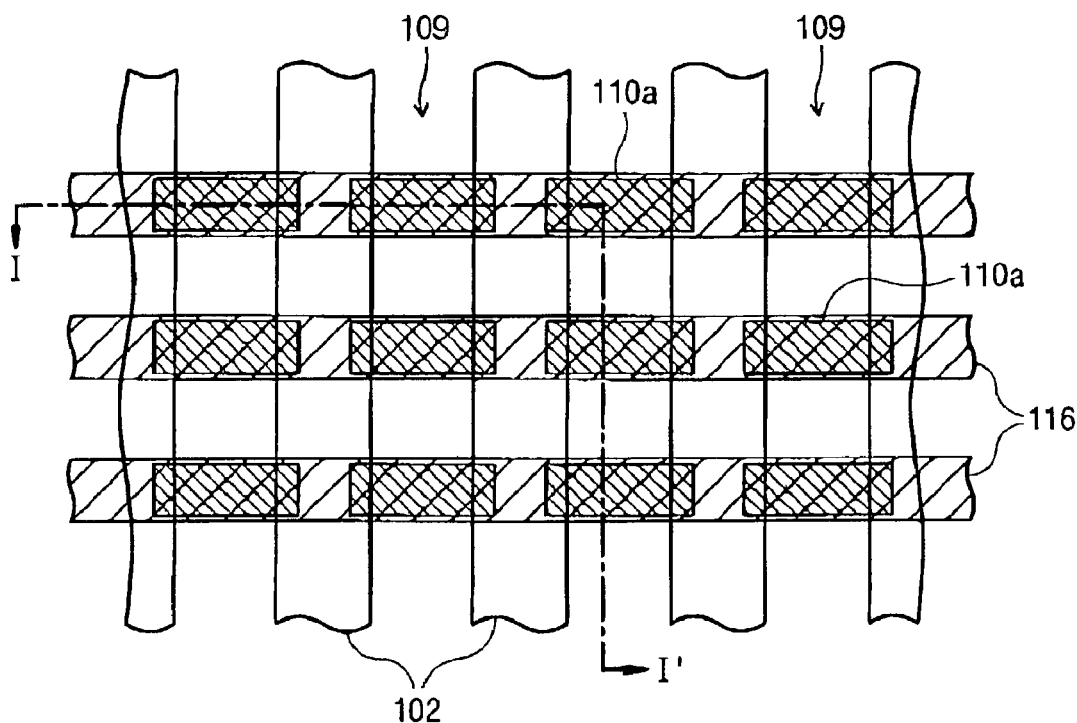
FIG. 1 illustrates a schematic top view of conventional flash memory cells.
Figure 2:
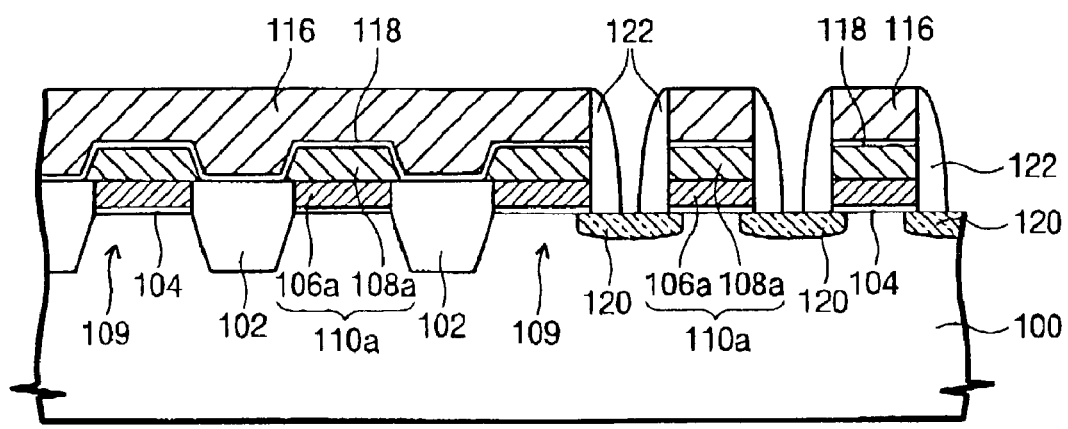
FIGS. 2 to 5 illustrate cross-sectional views of a conventional non-volatile memory device, taken along a direction I–I' of FIG. 1 and show a conventional process for fabricating a conventional non-volatile memory device.
Figure 3:
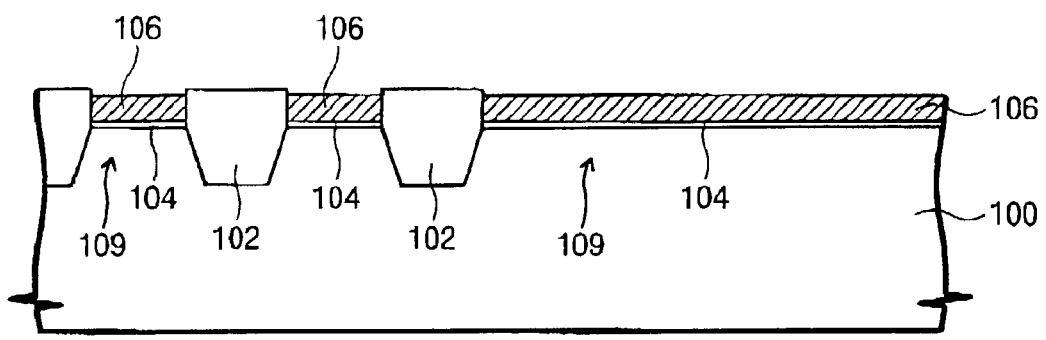
Figure 4:
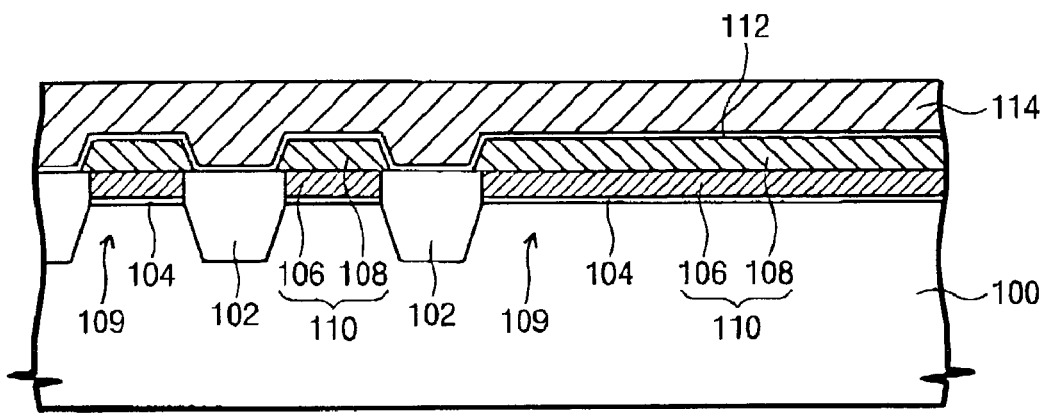
Figure 5:
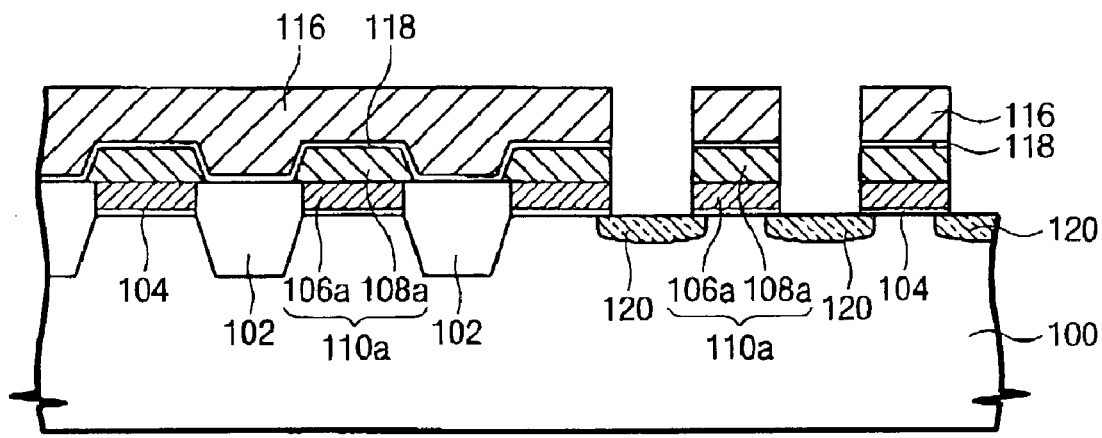

Korean Patent Application No. 2001-33549 filed on Jun. 14, 2001, and entitled "Semiconductor Device and Method of Fabricating The Same," is incorporated by reference herein in its entirety.

The present invention will now be described more fully hereinafter with reference to the accompanying drawings, in which preferred embodiments of the invention are illustrated. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

In the drawings, the thickness of some of the layers and regions are exaggerated for clarity.

It will be understood that when a layer is referred to as being "on" another layer or substrate, it can be directly on the layer or substrate, and one or more intervening layers may also be present.

It will also be understood that when a layer is referred to as being "under" (or "below") another layer, it can be directly under (or below), and one or more intervening layers may also be present.

Further, it will be understood that when a layer is referred to as being "between" two layers, it can be directly between the two layers touching the two layers, and one or more intervening layers may also be present.

In the present invention, the term 'first sidewall' means the sidewall below the word line touching the inter-device isolation insulator film, and the term 'second sidewall' means the sidewall in a direction perpendicular to the 'first sidewall', touching the impurity-diffused regions in the substrate.

Figure 6:
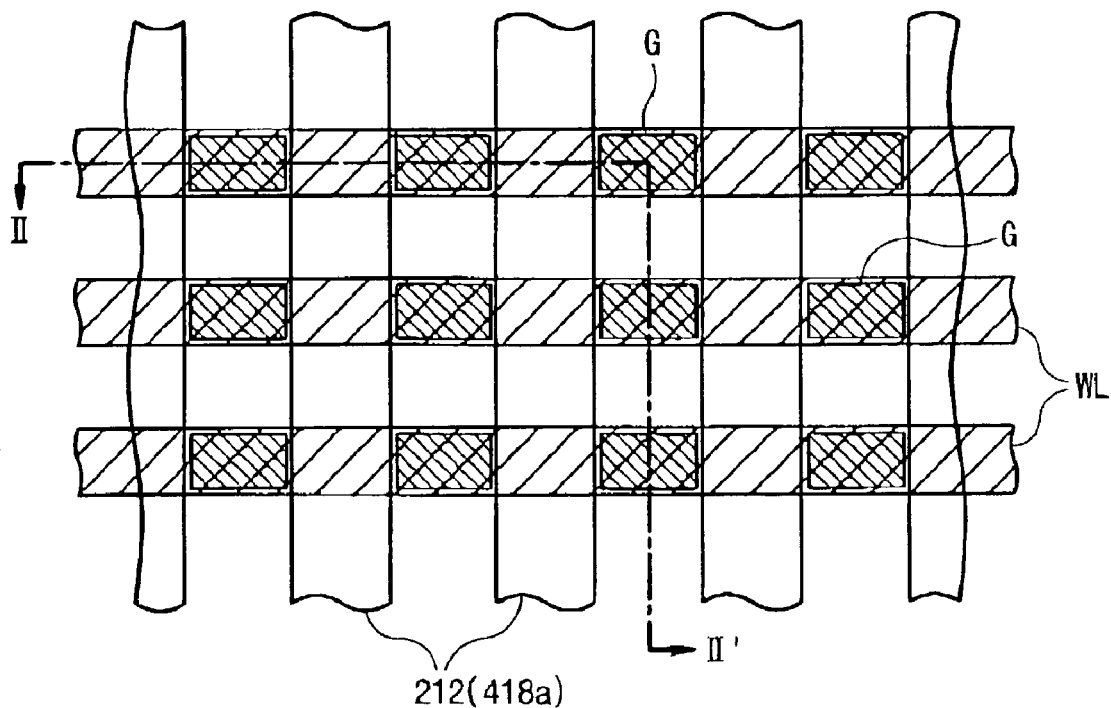
FIG. 6 illustrates a schematic top view of a flash memory cell according to an embodiment of the present invention.

FIG. 6 illustrates the top view of a semiconductor device according to the present invention.

First Embodiment

Figure 7:
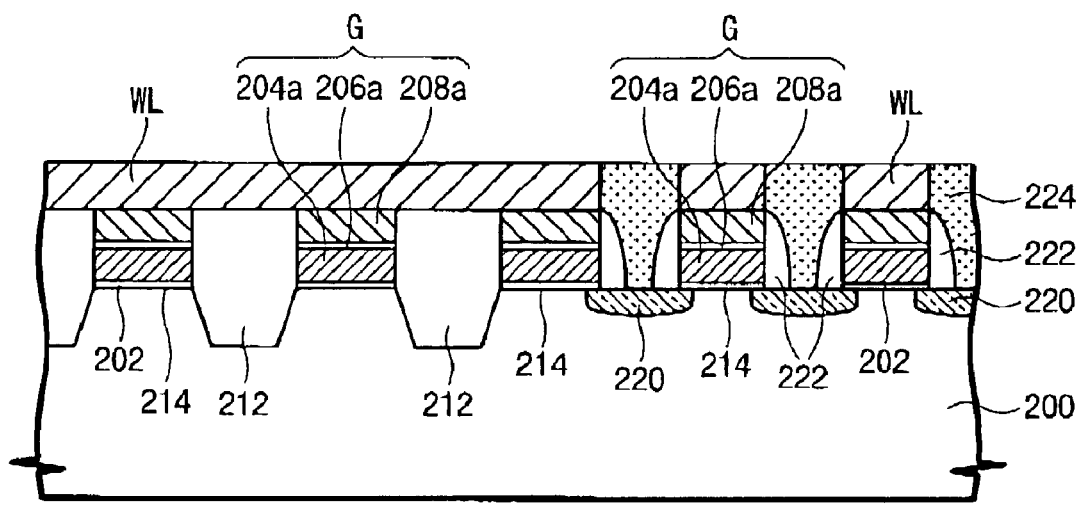
FIG. 7 illustrates a cross-sectional view of a semiconductor device according to a first embodiment of the present invention, taken along a direction II–II' of FIG. 6.

FIG. 7 illustrates a cross-sectional view of a semiconductor device according to the first embodiment of the present invention, taken along a direction II–II' of FIG. 6.

Referring to FIG. 6 and FIG. 7, a plurality of word lines (WL) cross over a device isolation film 212 (418a) disposed on a portion of a semiconductor substrate 200. The device isolation film 212 (418a) restricts a plurality of active regions 214. Gate patterns (G) are disposed between the active regions 214 and the word lines (WL). Each of the gate patterns (G) includes a floating gate 204a, a gate interlayer dielectric film pattern 206a, and a control gate electrode 208a deposited on the substrate. As shown in FIG. 7, each of the gate patterns (G) is arranged on the active regions 214 and has a sidewall self-aligned to the device isolation film 212 (418a).

The word lines (WL) connect the gate patterns (G) isolated by the device isolation film 212 (418a). Thus, floating gates isolated by the device isolation film 212 (418a) have no short problems due to etching stringer, unlike in the prior art. Thus, the line width of the device isolation film 212 (418a) may also be decreased. Tunnel oxide film 202 is disposed between the active regions 214 and the gate patterns (G). A gap area between the gate patterns (G), in a direction perpendicular to the word lines, is filled with an interlayer insulation film 224. The word lines (WL) contact to each of the control gate electrodes 208a of the gate patterns (G). A sidewall spacer 222 of the gate patterns (G) is formed at the same time a similar sidewall spacer is formed for the peripheral circuitry devices, and before forming the impurity diffusion regions 220.

The sidewall spacer 222 may not be formed in some instances.

FIGS. 8 to 12 illustrate cross-sectional views of a semiconductor device according a first embodiment of fabricating a semiconductor device according to the present invention, taken along a direction II–II' of FIG. 6.

Figure 8:
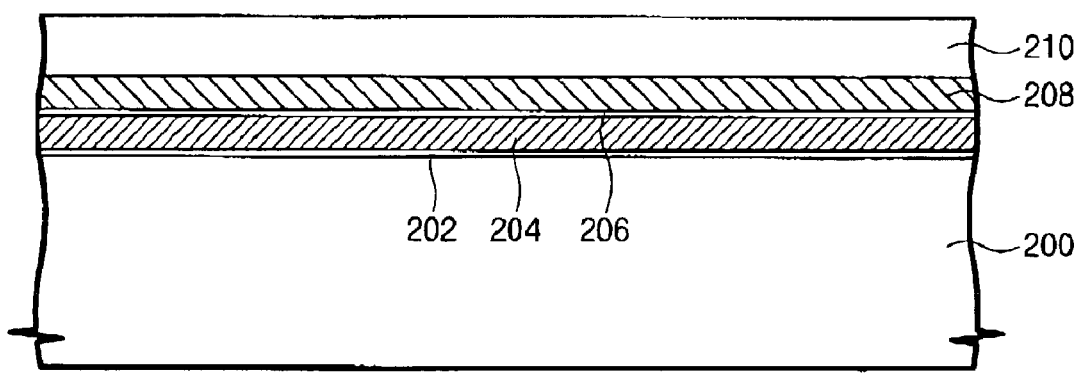
FIGS. 8 to 12 illustrate cross-sectional views of a semiconductor device according to a first embodiment of fabricating a semiconductor device according to the present invention, taken along a direction II–II' of FIG. 6.

Referring to FIG. 8, a tunnel oxide film 202, a first conductive film 204, a gate interlayer dielectric film 206, a second conductive film 208, and a hard mask film 210 are formed, in the stated order, on a semiconductor substrate 200. The tunnel oxide film 202 may be formed of a material selected from the group consisting of thermal oxide and silicon oxynitride with a preferred thickness of about 20 Å to about 200 Å. The first and second conductive films 204 and 208 may be poly silicon films, with a preferred thickness of between about 200 Å to about 5000 Å. The gate interlayer dielectric film 206 may be formed of a film having a high permittivity, preferably an oxide-nitride-oxide (ONO) film. The hard mask film 210 is an insulation film having a selective etching ratio, and is preferably formed by a silicon nitride film having a thickness between about 200 Å to about 5000 Å. Also, a silicon oxide film may be formed over the silicon nitride film.

Figure 9:
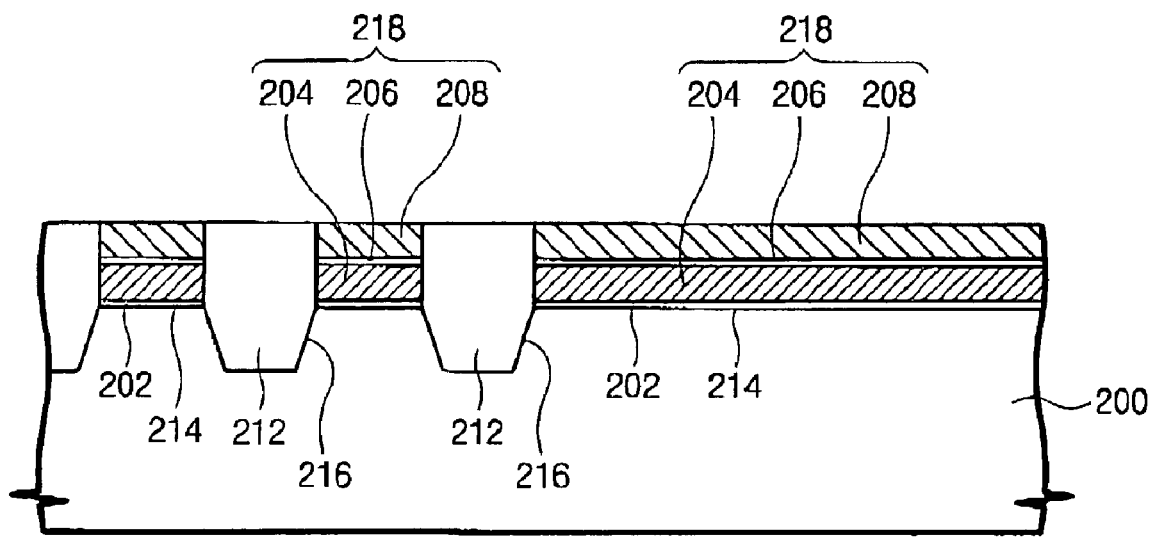

Referring to FIG. 9, the hard mask film 210, the second conductive film 208, the gate interlayer dielectric film 206, the first conductive film 204, the tunnel oxide film 202, and the semiconductor substrate 200 are patterned, in the stated order. As a result, a trench 216 restricting an active region 214 is formed on some portion of the semiconductor substrate 200, and a deposited pattern 218 and a hard mask film pattern (not shown) are formed on the active region 214. Then, an insulation material filling the trench 216 is formed over the entire surface of the semiconductor substrate 200, and the hard mask film pattern is then exposed by a flattening etching process. A device isolation film 212 is formed by recessing the insulation material in-between the hard mask film patterns, and then the hard mask film pattern is removed. As a result, the deposited pattern 218 has a sidewall self-aligned to the device isolation film 212.

Figure 10:
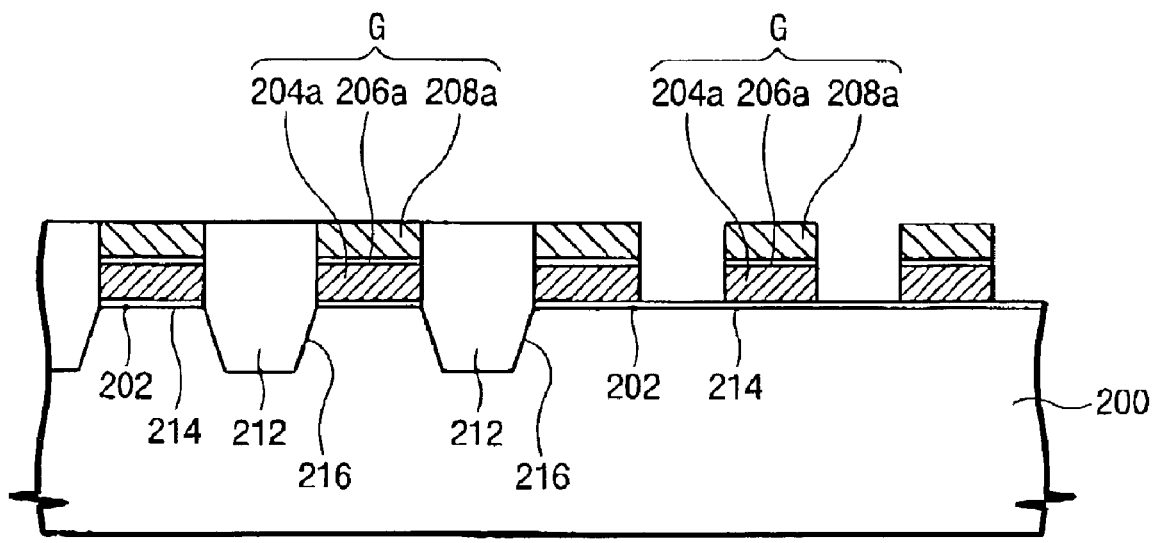

Referring to FIG. 10, by patterning the deposited pattern 218 and the tunnel oxide film 202, a plurality of gate patterns (G) self-aligned to the device isolation film 212 are formed on the active region 214. Each of the gate patterns (G) comprises a floating gate pattern 204a, a gate interlayer dielectric film pattern 206a, and a control gate electrode pattern 208a, in the stated order from bottom to the top, on the active region 214. The floating gate pattern 204a, the gate interlayer dielectric film pattern 206a, and the control gate electrode pattern 208a are formed of the first conductive film 204, the gate interlayer dielectric film 206, and the second conductive film 208, respectively.

Figure 11:
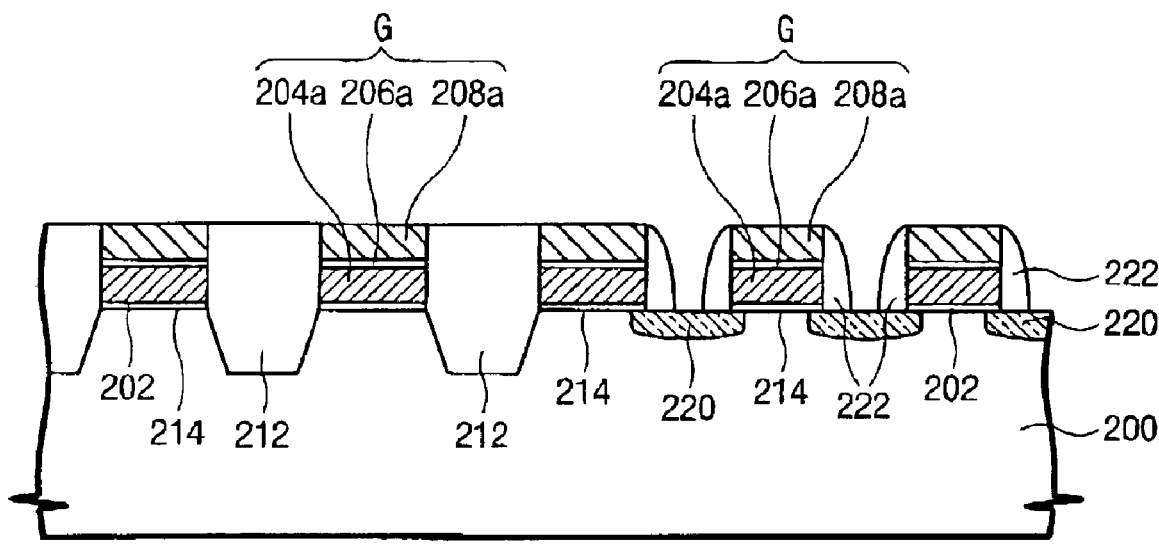

Referring to FIG. 11, an impurity diffusion layer 220 is formed on the active region in-between the gate patterns (G) by injecting an impurity. A sidewall spacer 222 shown in FIG. 11 is formed at the same time a similar sidewall spacer is formed for the peripheral circuitry devices, before forming the impurity diffusion region 220. Thus, if the impurity diffusion layer of dual structures is not formed in the peripheral circuitry, the sidewall spacer 222 may not be formed. The sidewall spacer is a conductive film, preferably a poly-silicon film.

Figure 12:
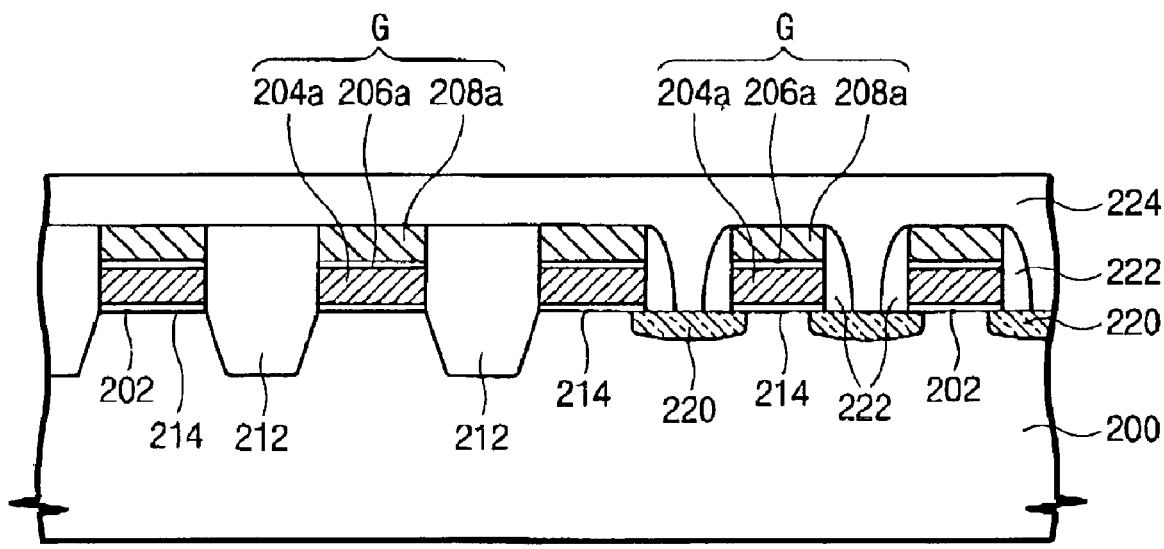

Referring to FIG. 12, an interlayer insulation film 224 filling a gap area in-between the gate patterns (G), in a direction perpendicular to the word lines, is formed over the entire surface of the semiconductor substrate 200. The interlayer insulation film 224 has a low permittivity, and may be formed preferably using a silicon oxide film.

A groove (not shown), exposing the control gate electrode 208a of the gate patterns (G) and across the device isolation film 212, is then formed by patterning the upper side of the interlayer insulation film 224. Next, a third conductive film filling the groove is formed, and then a word line (WL in FIG. 7) is formed by a flattening process of the third conductive film. The third conductive film has a high conductivity, and is formed preferably by a conductive film including tungsten (W-based) or copper (Cu-based). Also, the third conductive film may include preferably an interlayer metal film such as titanium (Ti) or titanium-nitride (TiN). This interlayer metal film improves adhesive property and prevents oxidation with any underlying material.

Second Embodiment

FIGS. 13 to 16 illustrate cross-sectional views of a second embodiment of the present invention, taken along a direction II–II' of FIG. 6.

Figure 13:
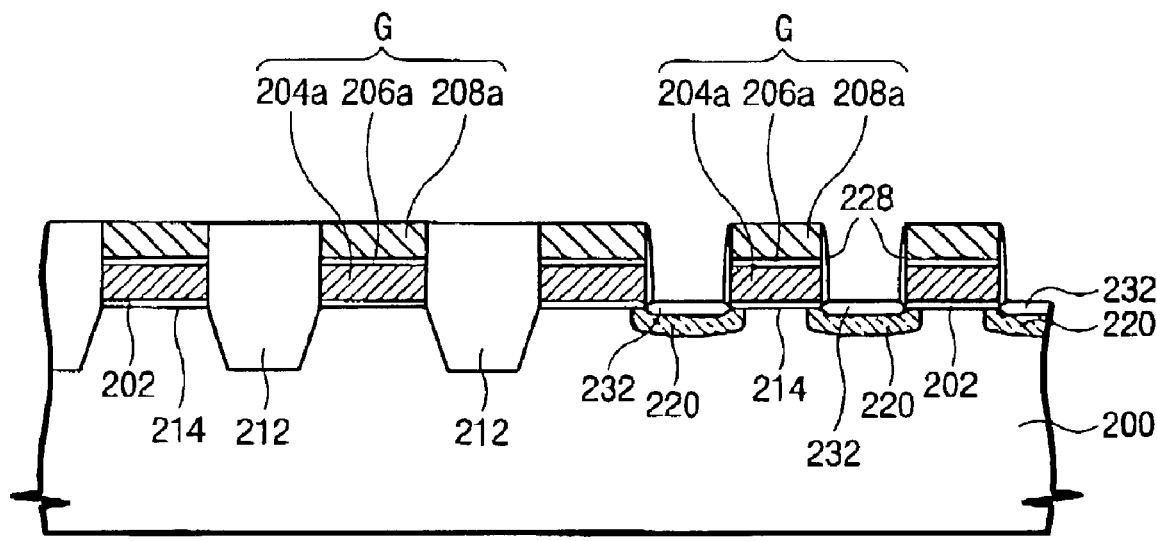
FIGS. 13 to 16 illustrate cross-sectional views of a semiconductor device according to a second embodiment of fabricating a semiconductor device according to the present invention, taken along a direction II–II' of FIG. 6.

The processes for forming a device isolation film 212 and gate patterns (G) are the same as those of the first embodiment as described in connection with FIG. 8 to FIG. 10. As shown in FIG. 13, an impurity diffusion layer 220 is formed on the active region in-between the gate patterns (G). Then, a sacrifice spacer 228 is formed on the sidewall of the gate patterns (G). The sacrifice spacer 228 prevents oxidation of the sidewall of the gate patterns (G) and preferably is formed of a silicon nitride film. A blocking oxide film 232 is formed on the active region, in-between the gate patterns (G), by performing a thermal oxidation process to the semiconductor substrate 200, which has the sacrifice spacer 228. The sacrifice spacer 228 prevents oxidation of the sidewall of the gate patterns (G) during the thermal oxidation process. As a result, the decrease of capacitance between a sidewall spacer, which is to be formed in a later process, and a floating gate, may be prevented.

Figure 14:
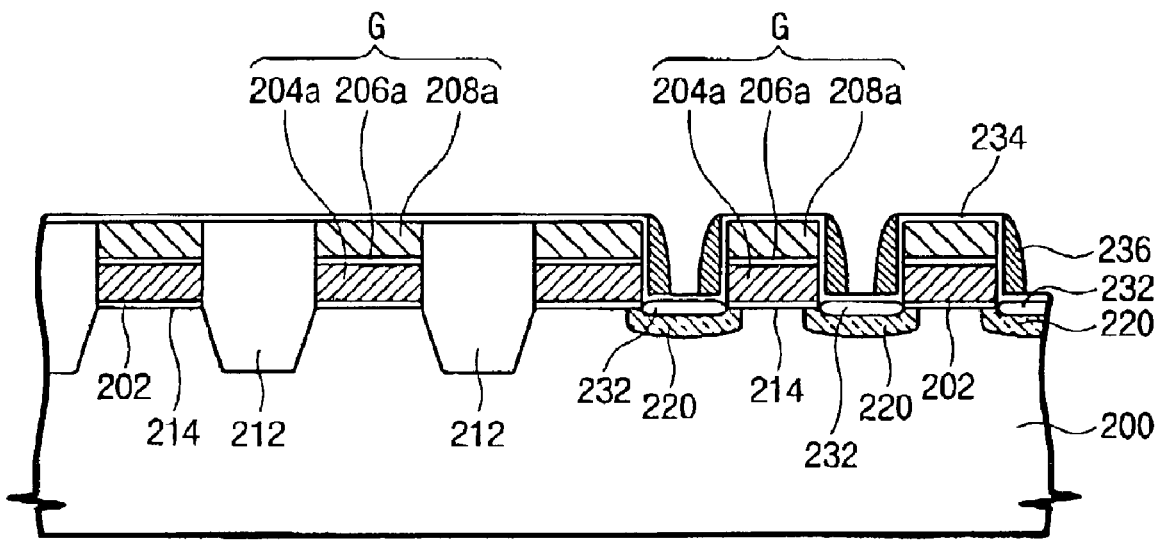

Referring to FIG. 14, the sacrifice spacer 228 is removed, and a dielectric material film 234 is conformally formed over the entire surface of the semiconductor substrate 200. The dielectric material film 234 has a high permittivity, and is preferably formed by an oxide-nitride-oxide (ONO) film. Next, a sidewall spacer 236 is formed on the sidewall of the gate patterns (G) covered with the dielectric material film 234. The sidewall spacer 236 is preferably formed of a conductive film such as a poly-silicon film. The sidewall spacer 236 is formed on the blocking oxide film 232.

Figure 15:
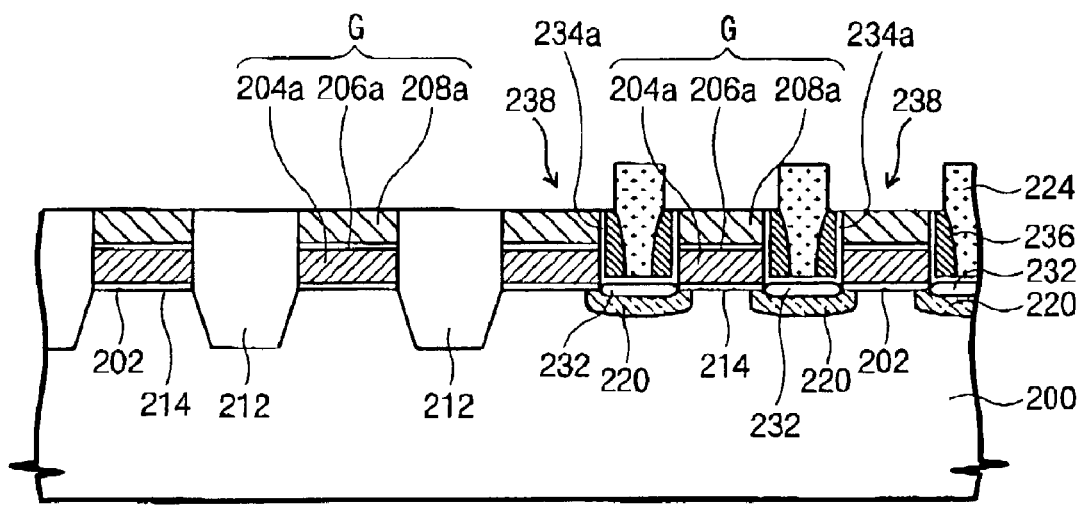

Referring to FIG. 15, an interlayer insulation film 224 filling a gap area in-between the gate patterns (G) is formed over the entire surface of the semiconductor substrate 200. Then, by patterning the interlayer insulation film 224, the dielectric material film 234 on the gate patterns (G) is eliminated, and a groove 238 exposing the gate patterns (G) is formed. The groove 238 is across the device isolation film 212, and exposes a control gate electrode 208a and the sidewall spacer 236 of the gate patterns (G). Therefore, a gate sidewall dielectric film 234a remains in-between the sidewall of the gate patterns (G) and the sidewall spacer 236.

Figure 16:
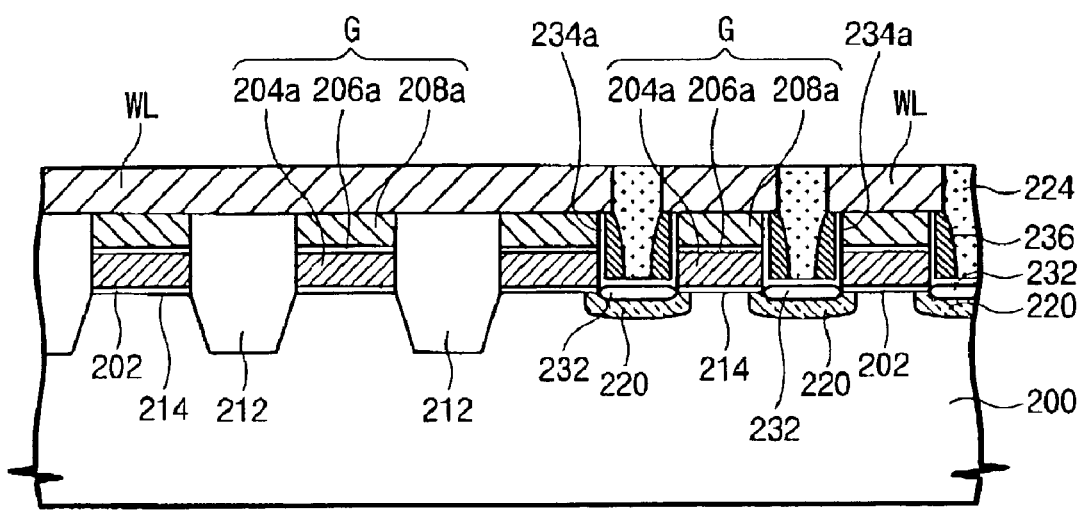

Referring to FIG. 16, as described in connection with the aforementioned first embodiment, a word line (WL) is formed by filling the groove 238 (FIG. 15) with a third conductive film. As shown in FIG. 16, the word line (WL) is commonly connected to the control gate electrode 208a and the sidewall spacer 236. Thus, because the gate sidewall dielectric film 234a covering the gate interlayer dielectric film 206a and the floating gate 204a results in a coupling, a high coupling ratio may be obtained.

Third Embodiment

Figure 17:
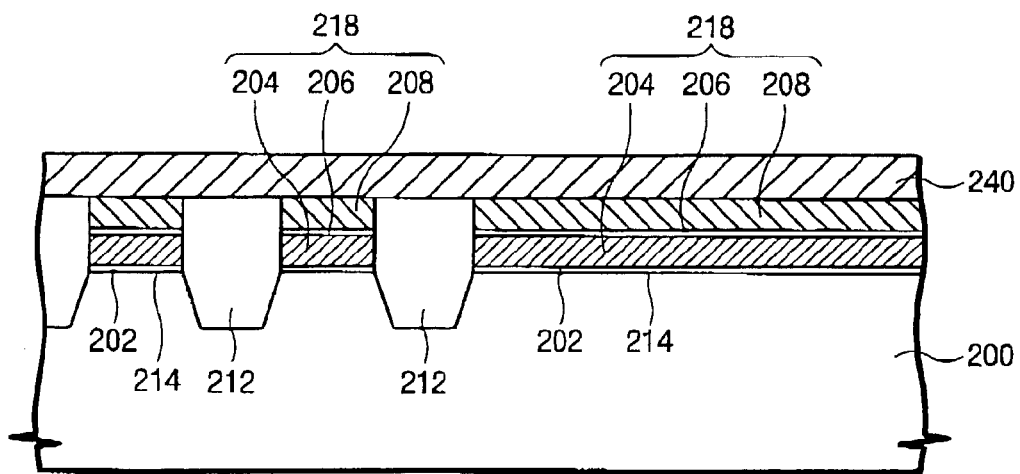
FIG. 17 and FIG. 18 illustrate cross-sectional views of a semiconductor device according to a third embodiment of fabricating a semiconductor device according to the present invention, taken along a direction II–II' of FIG. 6.
Figure 18:
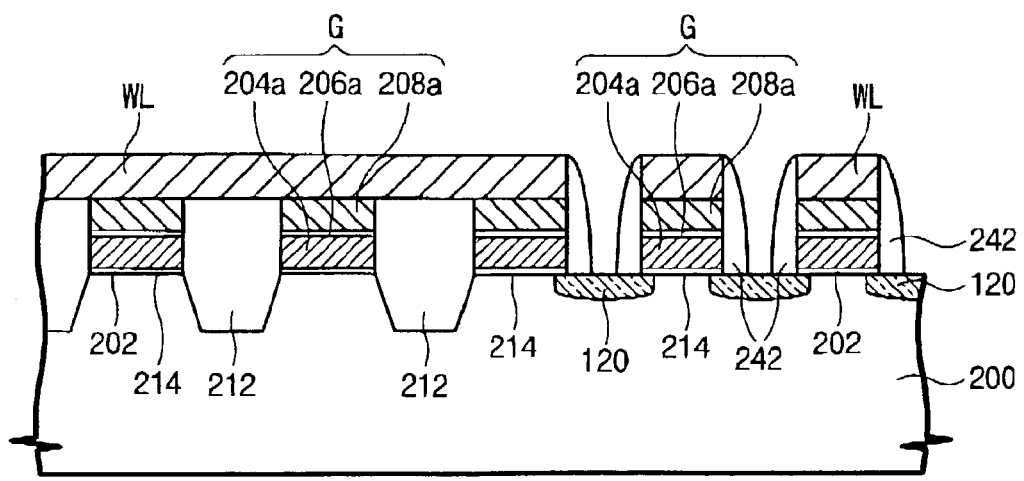

FIG. 17 and FIG. 18 illustrate cross-sectional views of a third embodiment of the present invention, taken along a direction II–II' of FIG. 6.

The process for forming a device isolation film 212 is the same as that of the first embodiment as explained above in connection with FIG. 8 and FIG. 9. Referring to FIG. 17, a device isolation film 212 restricting an active region 214 is arranged on a portion of a semiconductor substrate 200, and a deposited pattern 218 self-aligned to the device isolation film 212 is formed on the active region 214. The deposited pattern 218 is comprised of a first conductive film 204, a gate interlayer dielectric film 206, and a second conductive film 208 deposited in the stated order on the substrate 200. A tunnel oxide film 202 is disposed in-between the active region 214 and the deposited pattern 218. Next, a third conductive film 240 is formed over the entire surface of the semiconductor substrate 200. The third conductive film 240 may be formed of the same material film as the word line is made in the first embodiment (WL in FIG. 7).

Referring to FIG. 18, a gate pattern (G) self-aligned to the device isolation film 212 is formed on the active region 214 by patterning the third conductive film 240 (FIG. 17), the second conductive film 208, the gate interlayer dielectric film 206, and the first conductive film 204 and the tunnel oxide film 202, in the stated order. At the same time, a word line (WL) contacting the gate pattern (G) across over the device isolation film 212 is formed. The word line (WL) is comprised of the third conductive film 240. The gate pattern (G) is comprised of a floating gate pattern 204a, a gate interlayer dielectric film pattern 206a, and a control gate electrode pattern 208a deposited in the stated order. The floating gate pattern 204a is comprised of the first conductive film 204, and the gate interlayer dielectric film pattern 206a is comprised of the gate interlayer dielectric film 206. Also, the control gate electrode pattern 208a is comprised of the second conductive film 208. Next, an impurity diffusion layer 220 is formed, by injecting an impurity on the active region 214, in-between the gate patterns (G). As shown in FIG. 18, a sidewall spacer 242 is formed on the sidewall of the gate pattern (G). The sidewall spacer 242 is formed at the same time a similar sidewall spacer is formed in a peripheral circuitry. The sidewall spacer 242 may not be formed in some instances.

Fourth Embodiment

FIGS. 19 to 25 illustrate cross-sectional views of a fourth embodiment of the present invention, taken along a direction II–II' of FIG. 6.

Figure 19:
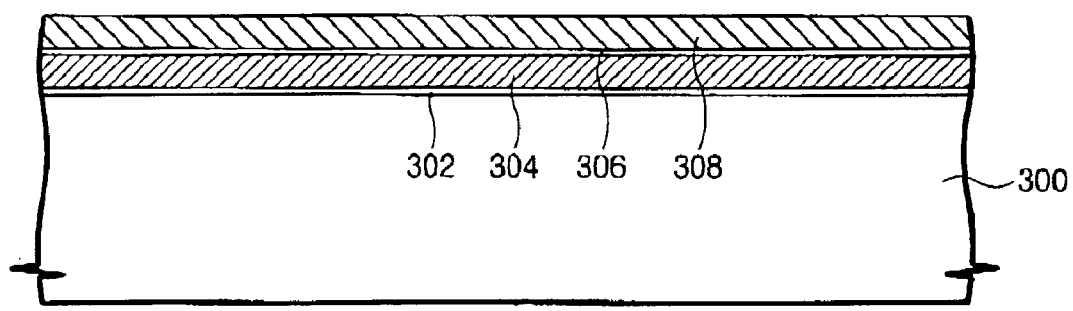
FIGS. 19 to 25 illustrate cross-sectional views of a semiconductor device according to a fourth embodiment of fabricating a semiconductor device according to the present invention, taken along a direction II–II' of FIG. 6.
Figure 20:
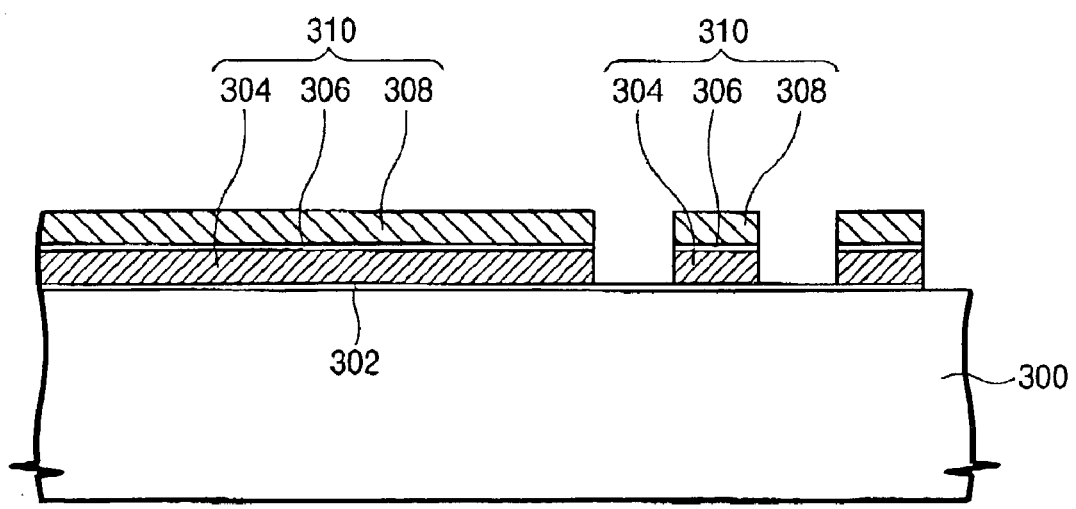

Referring to FIG. 19 and FIG. 20, a tunnel oxide film 302, a first conductive film 304, a gate interlayer dielectric film 306, and a second conductive film 308 are formed in the stated order on a semiconductor substrate 300. The tunnel oxide film 302, the first conductive film 304, the gate interlayer dielectric film 306, and the second conductive film 308 are formed using the same materials as used in the first embodiment of the present invention. Next, a gate line 310 is formed by patterning the second conductive film 308, the interlayer dielectric film 306, and the first conductive film 304 including the tunnel oxide film 302 in the stated order. In this case, the tunnel oxide film 302 may be patterned to expose the substrate between the gate lines 310; alternatively, the tunnel oxide film 302, between the gate lines 310, may be left alone without further patterning.

Figure 21:
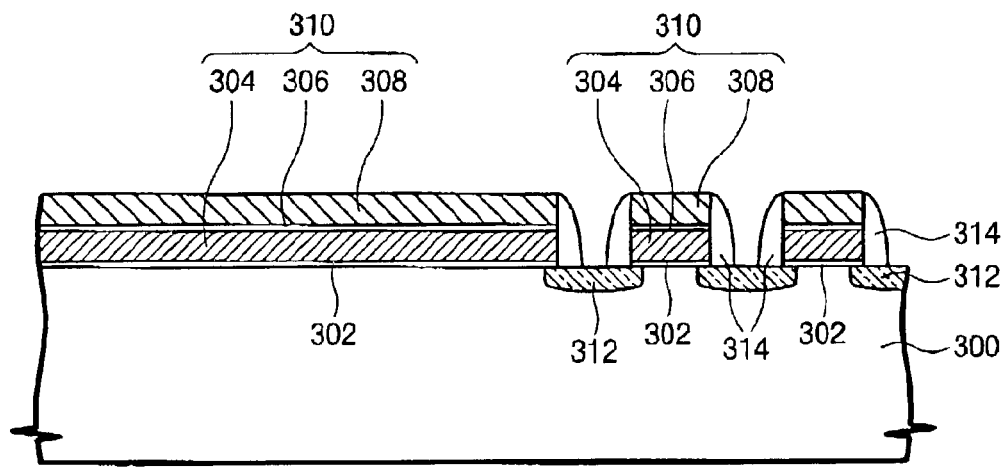
Figure 22:
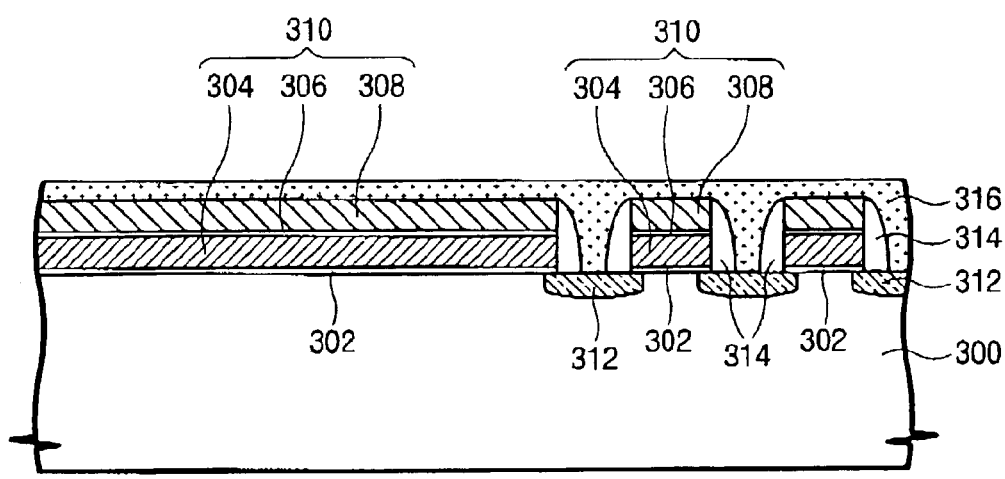

Referring to FIG. 21 and FIG. 22, an impurity diffusion layer 312 is formed by injecting an impurity in the semiconductor substrate 300 between the gate lines 310. Next, a sidewall spacer 314 is formed on the sidewall of the gate line 310. The sidewall spacer 314 may not be formed in some instances. Then, a first interlayer insulation film 316 filling gap areas between the gate lines 310 is formed over the entire surface of the semiconductor substrate 300 (FIG. 22). The first interlayer insulation film 316 preferably is formed of a silicon oxide film.

Figure 23:
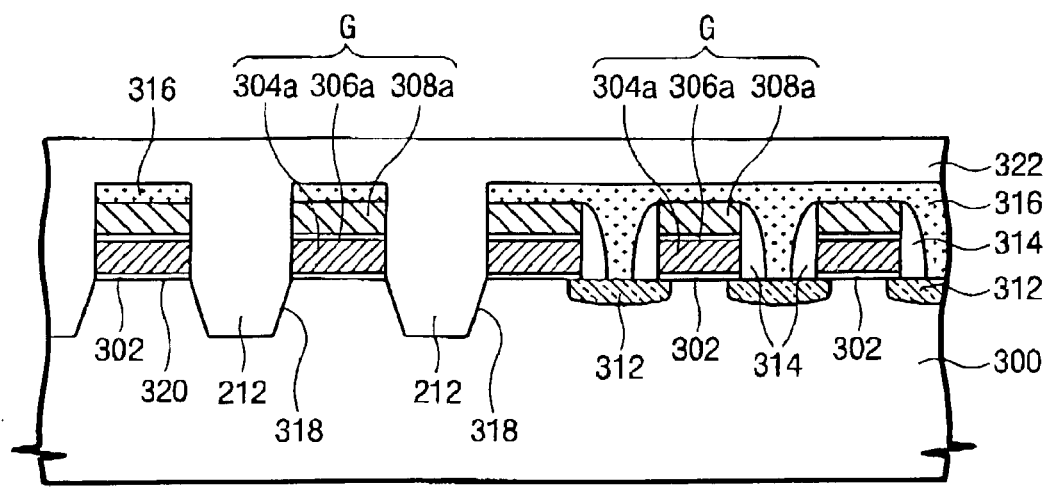

Referring to FIG. 23, a trench 318 restricting an active region 320 is formed by patterning the first interlayer insulation film 316, the gate line 310, including the tunnel oxide film 302, and the semiconductor substrate 300, in the stated order. At the same time, a gate pattern (G) separated by the trench 318 is formed on the active region 320. The gate pattern (G) is comprised of a floating gate pattern 304a, a gate interlayer dielectric film pattern 306a, and a control gate electrode pattern 308a, deposited in the stated order. The floating gate 304a is formed of the first conductive film 304, and the gate interlayer dielectric film pattern 306a is formed of the gate interlayer dielectric film 306. Also, the control gate electrode 308a is formed of the second conductive film 308. Next, a second interlayer insulation film 322 made of silicon oxide for filling gaps (trenches) in-between the gate patterns (G) is formed over the entire surface of the semiconductor substrate 300. The second interlayer insulation film 322 filling the trench 318 corresponds to a device isolation film 212.

Figure 24:
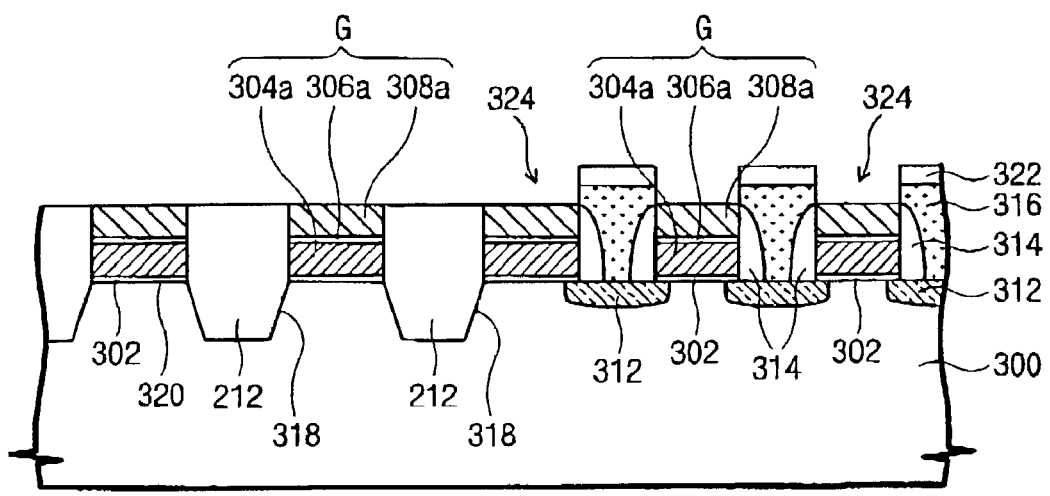
Figure 25:
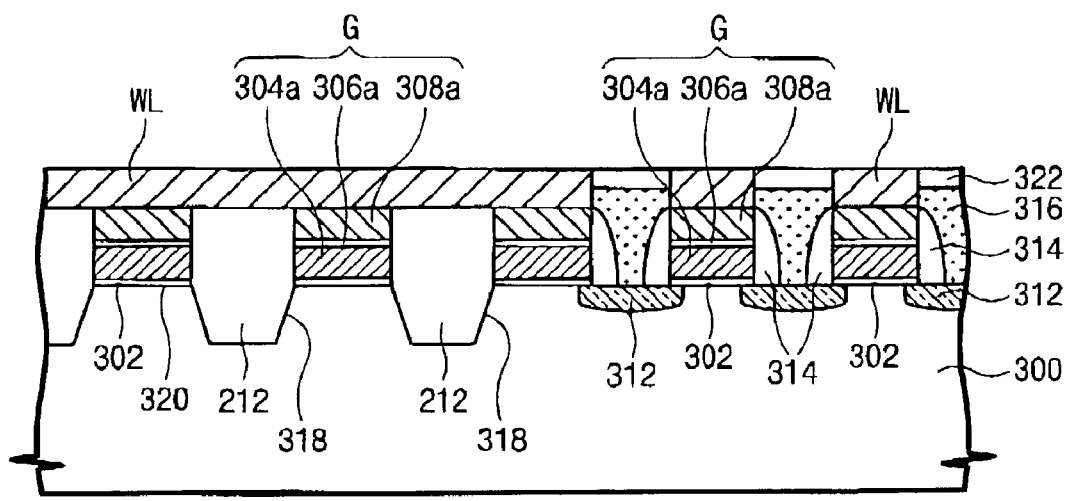

Referring to FIG. 24 and FIG. 25, a groove 324 exposing the control gate electrode 308a of the gate pattern (G) and across over the device isolation film 212 is formed by patterning the second interlayer insulation film 322 and the first interlayer insulation film 316 in the stated order. Next, as described in connection with the aforementioned first embodiment, a word line (WL) contacting the control gate electrode 308a and running across the device isolation film 212 is formed by filling the groove 324 with a third conductive film and then flattening the third conductive film.

Fifth Embodiment

Figure 26:
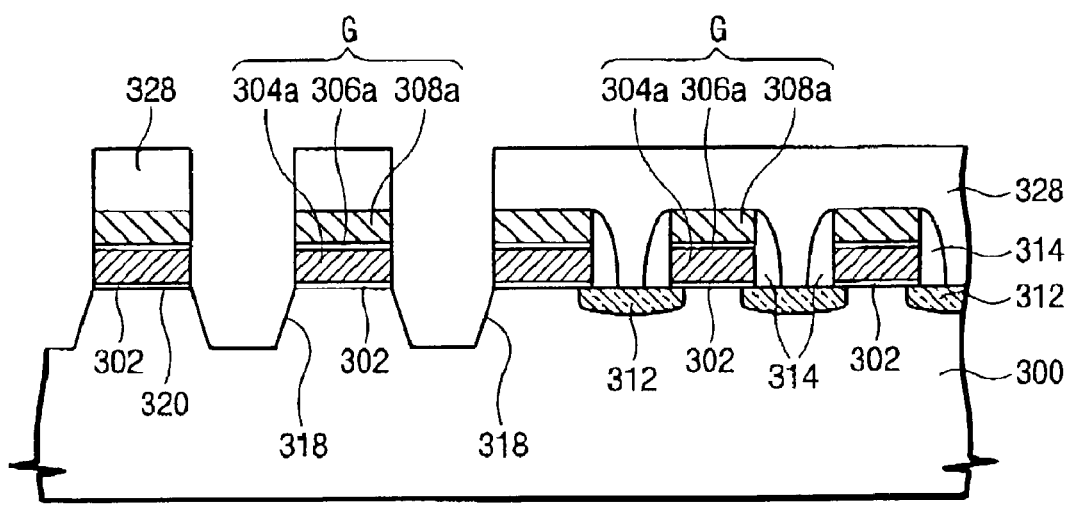
FIGS. 26 to 28 illustrate cross-sectional views of a semiconductor device according to a fifth embodiment of fabricating a semiconductor device according to the present invention, taken along a direction II–II' of FIG. 6.
Figure 27:
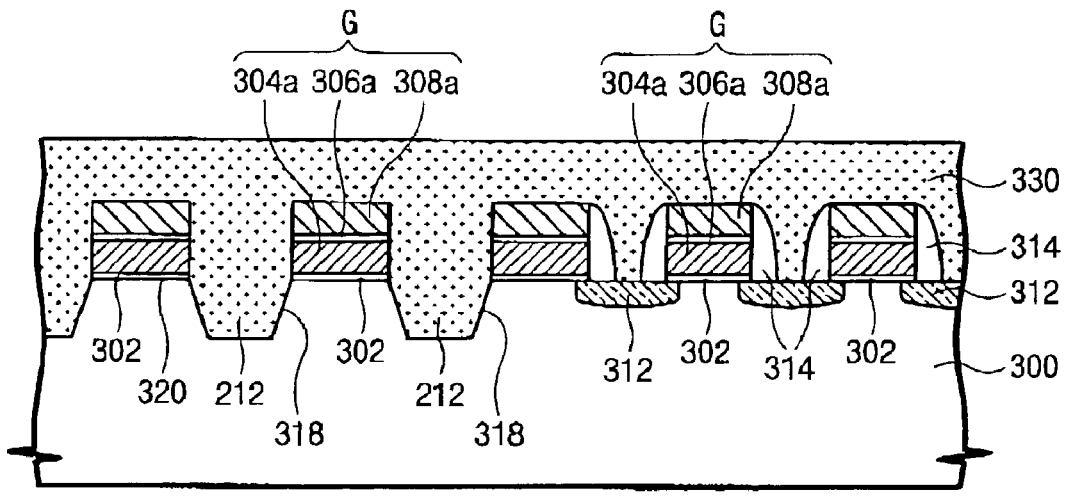
Figure 28:
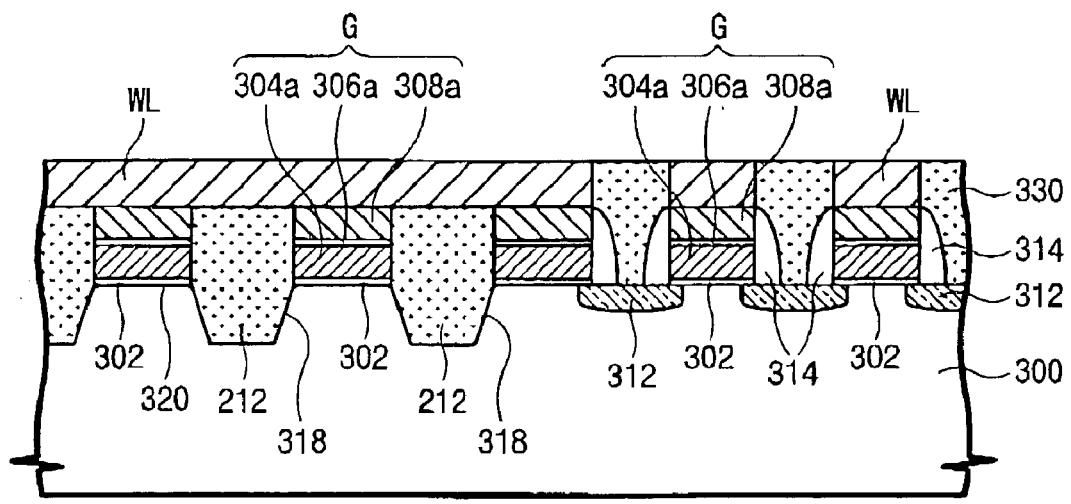

FIGS. 26 to 28 illustrate cross-sectional views of a fifth embodiment of the present invention, taken along a direction II–II' of FIG. 6. The processes for forming a gate line 310 (FIG. 20), an impurity diffusion layer 312, and a sidewall spacer 314 are the same as described above in connection with the fourth embodiment shown in FIGS. 19 to 21.

Referring to FIG. 26, a photo-resist is formed (not shown) over the entire surface of a semiconductor substrate 300 on which the gate line 310 (shown in FIG. 20), the impurity diffusion layer 312, and the sidewall spacer 314 are formed. Next, a photo-resist pattern 328, for etching a trench, is formed, by patterning the photo-resist. A trench 318 restricting an active region 320 is formed by using the photo resist pattern 328 as an etching mask and by patterning the gate line 310, a tunnel oxide film 302, and the semiconductor substrate 300 in the stated order. At the same time, a gate pattern (G) separated by the trench 318 is formed on the active region 320. The gate pattern (G) is comprised of a floating gate pattern 304a, a gate interlayer dielectric film pattern 306a, and a control gate electrode pattern 308a, deposited in the stated order. Then, the photo resist pattern 328 is removed.

Referring to FIG. 27, an interlayer insulation film 330 filling the gaps in-between gate patterns (G) and the trenches 318 is formed over the entire surface of the semiconductor substrate 300. The interlayer insulation film 330 made of silicon oxide for filling the trench 318 corresponds to a device isolation film 212.

Referring to FIG. 28, as described above in connection with the fourth embodiment of the present invention, a groove exposing the control gate electrode 308a of the gate pattern (G) and across over the device isolation film 212 is formed by patterning the interlayer insulation film 330. Next, a word line (WL) contacting the control gate electrode 308a and running across the device isolation film 212 is formed by filling the groove with a third conductive film and then flattening the third conductive film.

Sixth Embodiment

Figure 29:
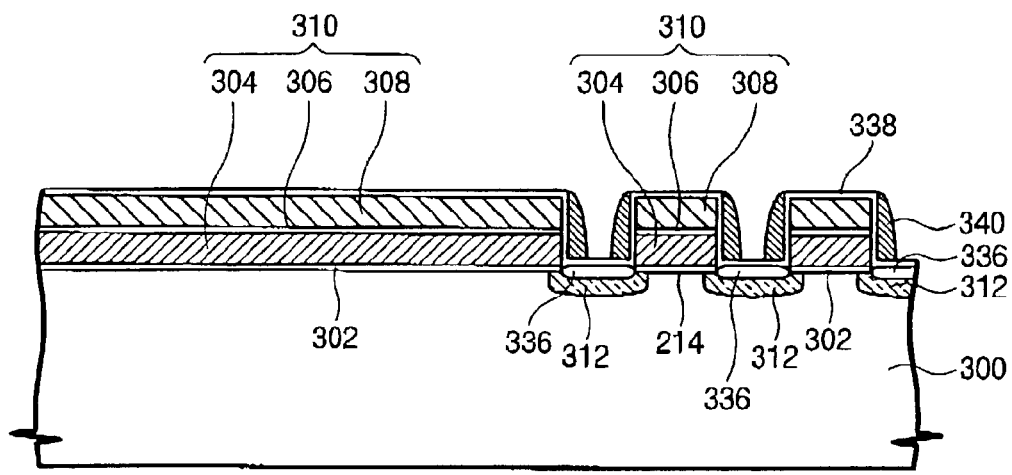
FIG. 29 and FIG. 30 illustrate cross-sectional views of a semiconductor device according to a sixth embodiment of fabricating a semiconductor device according to the present invention, taken along a direction II–II' of FIG. 6.
Figure 30:
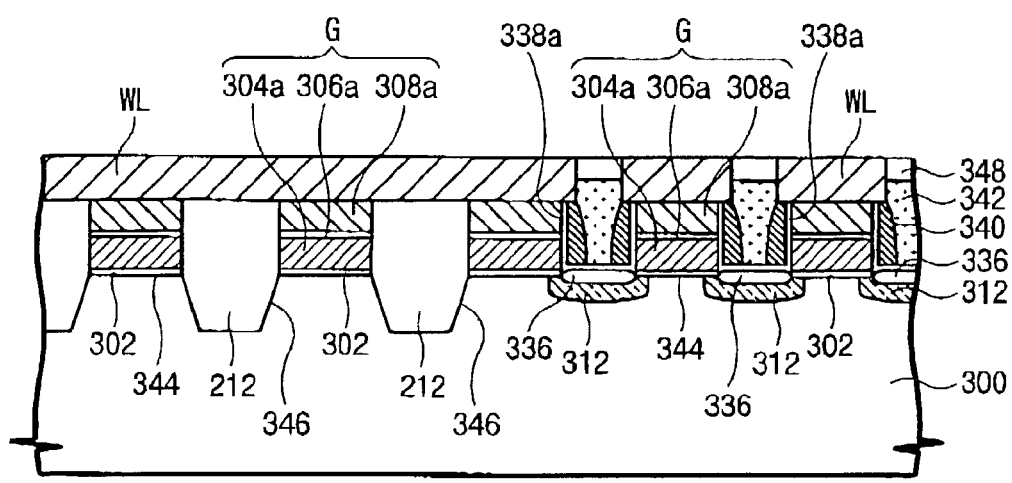

FIG. 29 and FIG. 30 illustrate cross-sectional views of a sixth embodiment of the present invention, taken along a direction II–II' of FIG. 6.

Referring to FIG. 29, the process for forming a gate line 310 is the same as that of the fourth embodiment as explained in connection with FIG. 19 and FIG. 20. The impurity diffusion layer 312 is then formed on the semiconductor substrate 300 in-between the gate lines 310. A blocking silicon oxide film 336 is then formed on the semiconductor substrate 300 outside of the gate line 310. The process for forming the blocking oxide film 336 is similar to that of the second embodiment as explained in connection with FIG. 13 and FIG. 14. That is, a thin sacrifice spacer (228 in FIG. 13) is formed on a sidewall of the gate line 310, and the blocking oxide film 336 is formed by performing a thermal oxidation process on the semiconductor substrate 300. Next, the sacrifice spacer is removed, and a dielectric material film 338 is conformally formed over the entire surface of the semiconductor substrate 300, including the sidewalls of the gate lines 310. The dielectric material film 338 has a high permittivity, and is preferably formed by an oxide-nitride-oxide (ONO) film. Next, a sidewall spacer 340 is formed on the sidewall of the gate line 310 covered with the dielectric material film 338. The sidewall spacer 340 is preferably formed of a conductive film such as a polysilicon film.

Referring to FIG. 30, the subsequent processes are similar to those as described above in connection with the fourth embodiment of the present invention as shown in FIGS. 22 to 25. That is, a first interlayer insulation film 342 filling gaps in-between the gate lines 310 is formed. The first interlayer insulation film 342 may be preferably formed of a silicon oxide film. Next, a trench 346 restricting an active region 344 in the semiconductor substrate 300 is formed, and a gate pattern (G) is formed on the active region 344, simultaneously, by etching the dielectric material film 338, the second conducting film 308, the gate interlayer insulator film 306, the first conductor film 304, the tunnel oxide film 302, and the substrate 300, in the stated order. A second interlayer insulation film 348 filling the trench 346 is then formed over the entire surface of the semiconductor substrate 300, and a groove is formed by patterning the second interlayer insulation film 348 and the first interlayer insulation film 342 in the stated order. Next, a word line (WL) is formed, by filling the groove with a conductive film. The second interlayer insulation film 348 formed in the trench 346 corresponds to a device isolation film 212.

Seventh Embodiment

Figure 31:
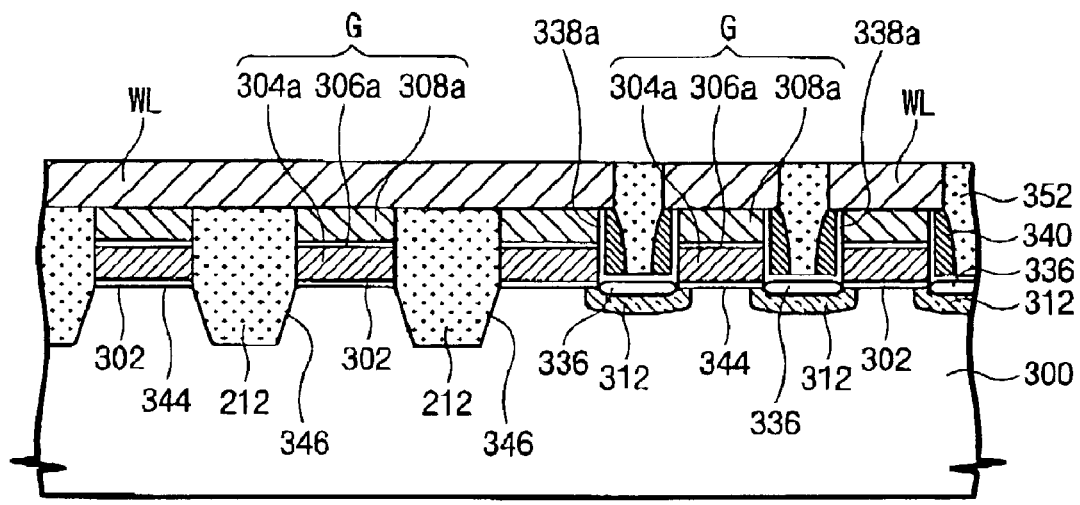
FIG. 31 illustrates a cross-sectional view of a seventh embodiment of fabricating a semiconductor device according to the present invention, taken along a direction II–II' of FIG. 6.

FIG. 31 illustrates a cross-sectional view of a seventh embodiment of the present invention, taken along a direction II–II' of FIG. 6.

In this embodiment, the process for forming a gate line, a blocking insulation film 336, a dielectric material film 338*a*, and a sidewall spacer 340 are the same as those as described in connection with the fourth embodiment of the present invention as shown in FIG. 19 and FIG. 20 and the sixth embodiment of the present invention shown in FIG. 29. Subsequent processes are similar to those as described in connection with the fifth embodiment of the present invention as shown in FIG. 26 and FIG. 27. A photo-resist pattern (328 in FIG. 26) is formed, and the photo-resist pattern is removed after a trench 346 is formed. Next, an interlayer insulation film 352 is formed, by filling the trench 346 with an insulation material. The interlayer insulation film 352 formed in the trench 346 corresponds to a device isolation film 212. Next, a word line (WL) contacting gate patterns (G) across the device isolation film 212 is formed. The word line (WL) is commonly connected to the control gate electrode 308*a* and the sidewall spacer 340.

According to aforementioned embodiments of the present invention, a gate pattern self-aligned to a device isolation film is formed, and the gate pattern separated by the device isolation film is connected to a word line. Thus, because formation of the device isolation is much easier than in the prior art, areas required for cell array may be reduced remarkably. This technology for non-volatile memory devices having a floating gate may be also applied to other semiconductor devices.

Eighth Embodiment

FIGS. 32 to 37 illustrate cross-sectional views of an eighth embodiment of the present invention, taken along a direction II–II' of FIG. 6.

Figure 32:
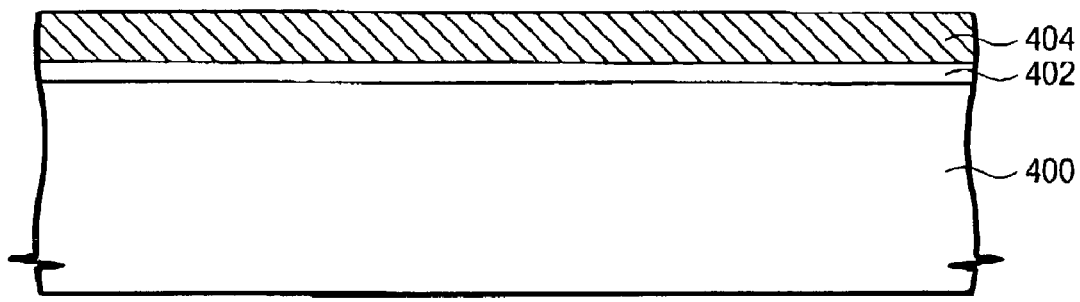
FIGS. 32 to 37 illustrate cross-sectional views of a semiconductor device according to an eighth embodiment of fabricating a semiconductor device according to the present invention, taken along a direction II–II' of FIG. 6.

Referring to FIG. 32, a gate insulation film 402 and a gate conductive film 404 are formed on a semiconductor substrate 400 in the stated order. The gate insulation film 402 is formed by depositing a plurality of insulation films, and includes at least one insulation film having a high trap density. For example, the gate insulation film 402 is preferably formed of an oxide-nitride-oxide (ONO) film. The gate conductive film 404 is preferably formed of a ploysilicon film.

Figure 33:
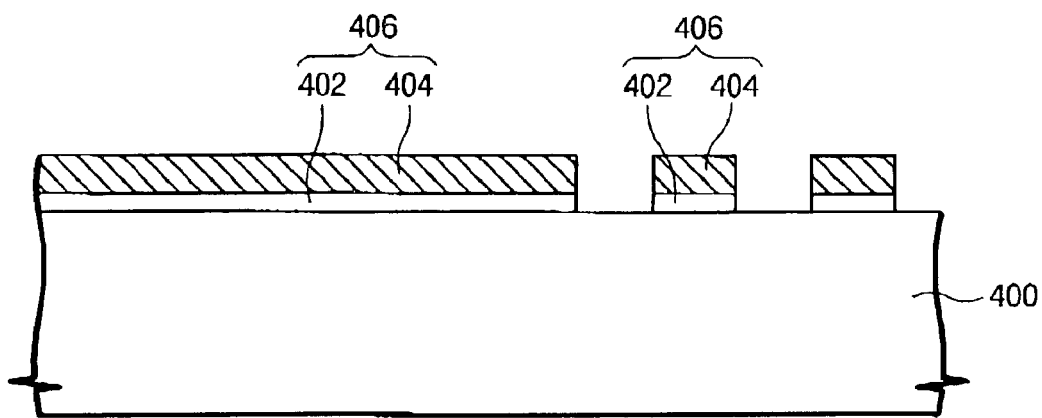

Referring to FIG. 33, a gate line 406 is formed by patterning the gate conductive film 404 and the gate insulation film 402 in the stated order.

Figure 34:
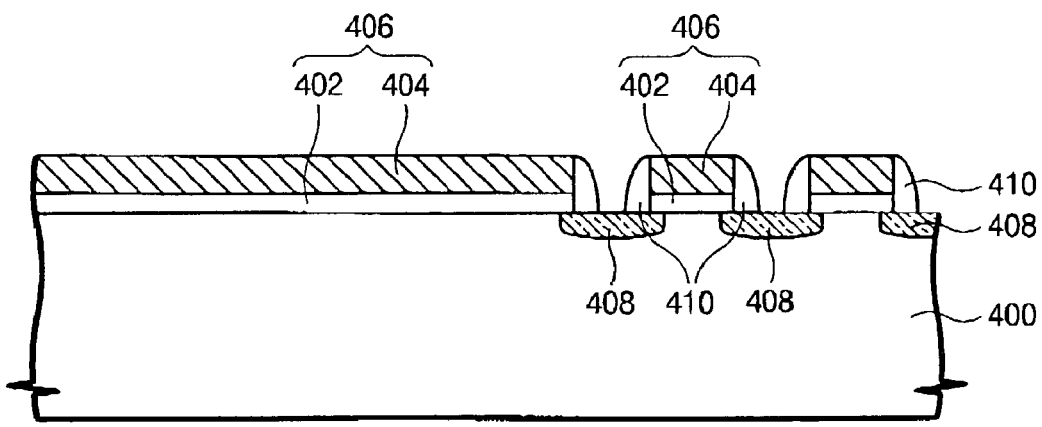

Referring to FIG. 34, an impurity diffusion layer 408 is formed by injecting an impurity into the semiconductor substrate 400 outside of the gate line 406. A sidewall spacer 410 formed on a sidewall of the gate line 406 is formed at the same time an impurity diffusion layer of dual structures is formed in a peripheral circuitry. Thus, the sidewall spacer 410 may not be formed in some instances.

Figure 35:
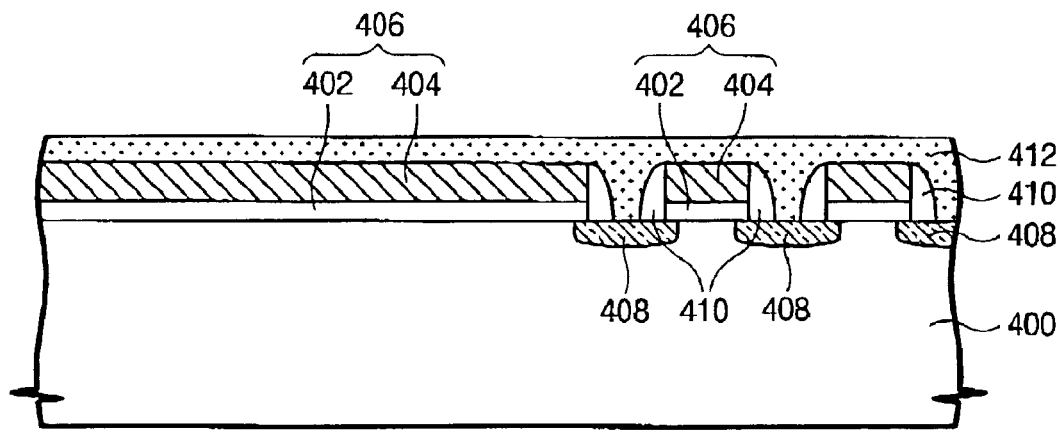

Referring to FIG. 35, a first interlayer insulation film 412 filling a gap area outside of the gate line 406 is formed over the entire surface of the semiconductor substrate 400. The first interlayer insulation film 412 is preferably formed of a silicon oxide film.

Figure 36:
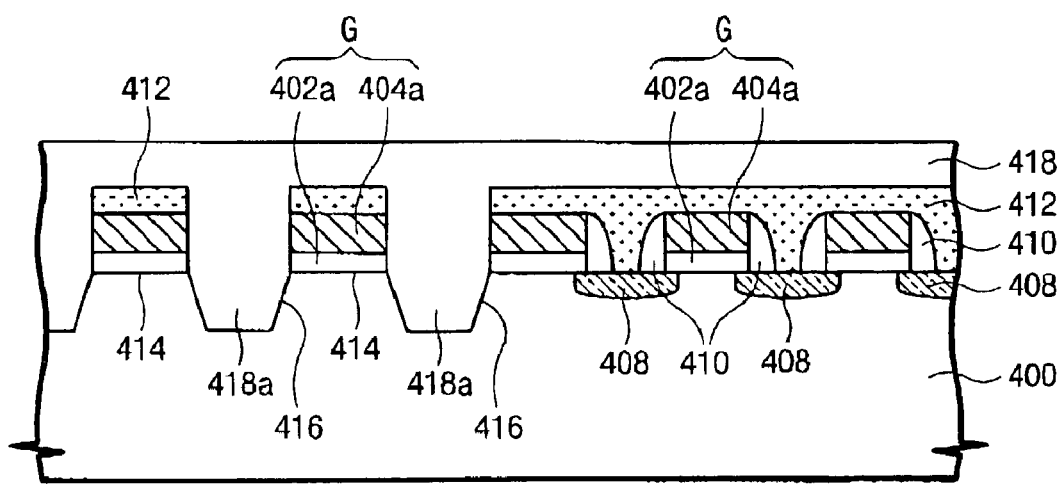

Referring to FIG. 36, a trench 416 restricting an active region 414 is formed by patterning the first interlayer insulation film 412, the gate line 406, and the semiconductor substrate 400 in the stated order. At the same time, a gate pattern (G) separated by the trench 416 is formed on the active region 414. The gate pattern (G) comprises a charge storage layer 402*a* and a gate electrode 404*a*, deposited in the stated order. The charge storage layer 402*a* is formed of the gate insulation film 402, and the gate electrode 404*a* is formed of the gate conductive film 404. Next, a second interlayer insulation film 418 is formed over the entire surface of the semiconductor substrate 400. The second interlayer insulation film 418 filling the trench 416 corresponds to a device isolation film 418*a*.

Figure 37:
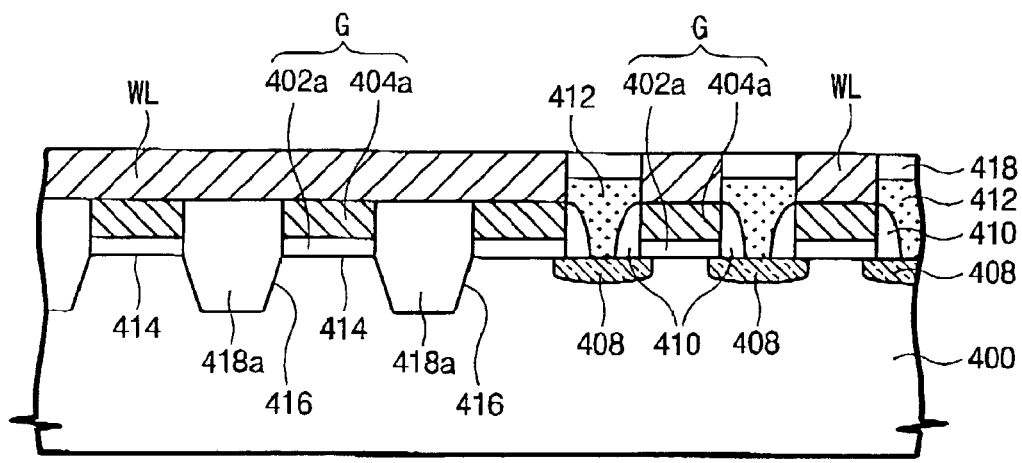

Referring to FIG. 37, a groove exposing the gate electrode 404*a* of the gate pattern (G) and across over the device isolation film 418*a* is formed by patterning the second interlayer insulation film 418 and the first interlayer insulation film 412 in the stated order. Next, a word line (WL) is formed, by filling the groove with a conductive film.

Ninth Embodiment

Figure 38:
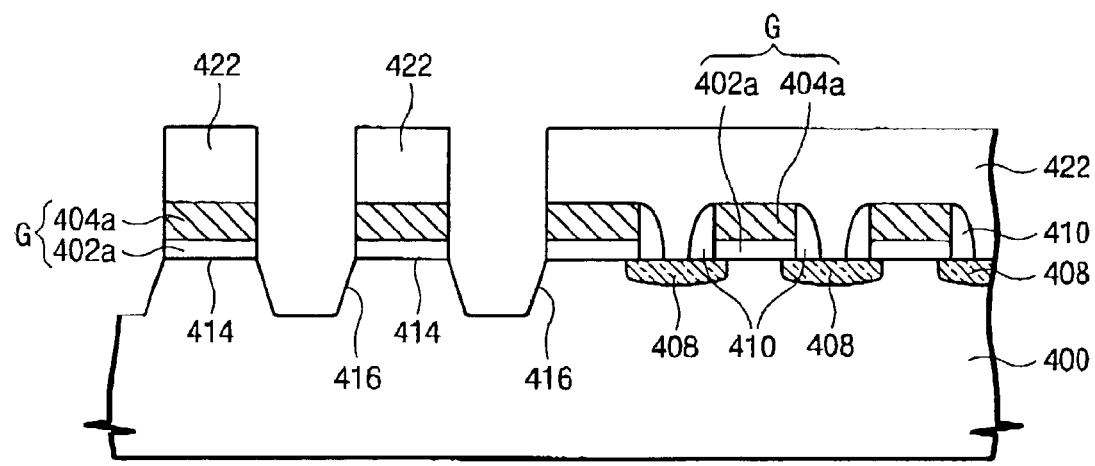
FIGS. 38 to 40 illustrate cross-sectional views of a semiconductor device according to a ninth embodiment of fabricating a semiconductor device according to the present invention, taken along a direction II–II' of FIG. 6.
Figure 39:
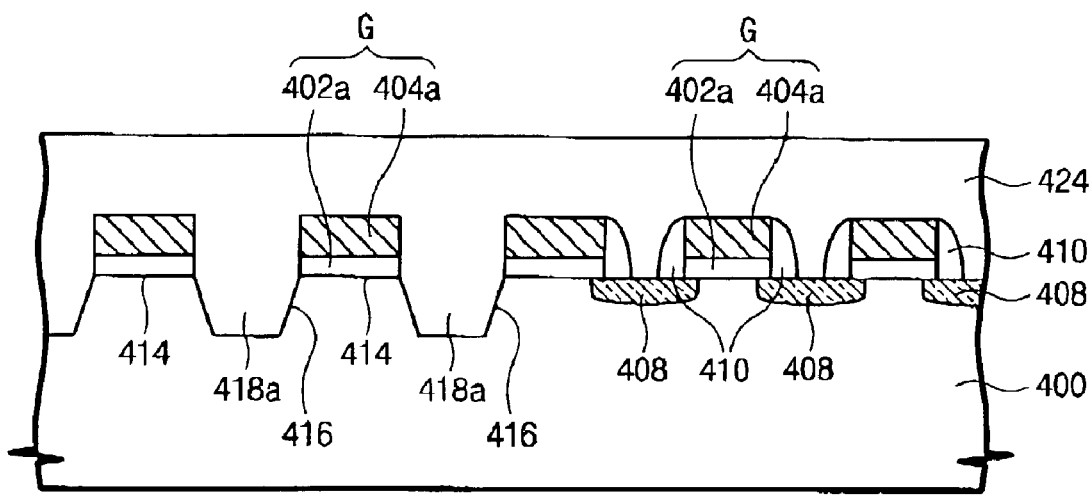
Figure 40:
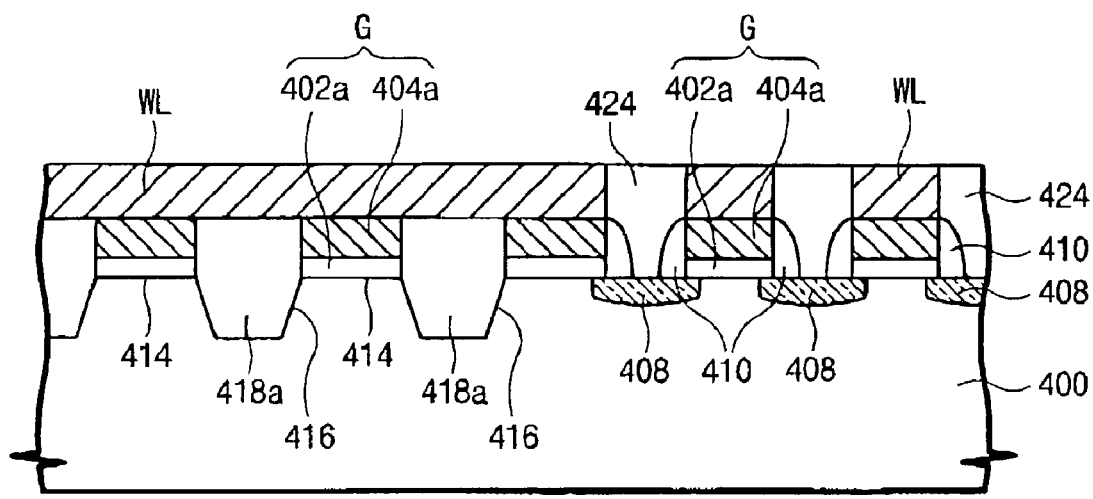

FIGS. 38 to 40 illustrate cross-sectional views of a ninth embodiment of the present invention, taken along a direction II–II' of FIG. 6.

Referring to FIG. 38, a gate line (406 in FIG. 33) is formed on a semiconductor substrate 400 through the same processes as described above in connection with the eighth embodiment of the present invention as shown in FIGS. 32 to 34, and an impurity diffusion layer 408 is formed in the semiconductor substrate 400 outside of the gate line. Also, a sidewall spacer (410 in FIG. 34) may be formed on a sidewall of the gate line. Next, a photo-resist is formed over the entire surface of the semiconductor substrate 400, and then a photo-resist pattern 422 for etching a trench 416 is formed, by patterning the photo-resist. The trench 416 restricting an active region 414 is formed, by using the photo-resist pattern 422 as an etching mask and by patterning the gate line 406 and the semiconductor substrate 400, in the stated order. At the same time, a gate pattern (G) separated by the trench 416 is formed on the active region 414. The gate pattern (G) is comprised of a charge storage layer 402*a* and a gate electrode 404*a* deposited in the stated order on the semiconductor substrate 400. Then, the photo-resist pattern 422 is removed.

Referring to FIG. 39, an interlayer insulation film 424 filling gaps outside of the gate pattern (G) is formed over the entire surface of the semiconductor substrate 400. The interlayer insulation film 424 filling the trench 416 corresponds to a device isolation film 418a.

Referring to FIG. 40, a groove exposing the gate electrode 404a of the gate pattern (G) and across over the device isolation film 418a is formed by patterning the interlayer insulation film 424. Next, a word line (WL) is formed, by filling the groove with a conductive film and flattening the conductive film. The conductive film is preferably formed, by depositing an interlayer metal film and a conductive film. This interlayer metal film improves the adhesive property of the interlayer insulation film 424 and prevents oxidation of the conductive film.

The word line (WL) or the third conducting film in the above and succeeding embodiments of the invention may be made of a polycide film or a metal film. An interlayer metal film may also be used along with a polycide film or a metal film to avoid oxidation of the polycide or the metal film. The metal film may be formed of W-based or Cu-based material, and the interlayer metal film may be formed of Ti or TiN.

The gate insulation film in the above embodiments includes at least one silicon nitride layer. The gate insulation film is preferably formed of silicon oxide-silicon nitride-silicon oxide (ONO). The gate insulation layer comprises an insulating layer having a high density trap zone, rather than silicon oxide or silicon oxynitride. In addition, the dielectric material film between the sidewall spacer and the sidewall of the gate line pattern is deleted.

Tenth Embodiment

Figure 41:
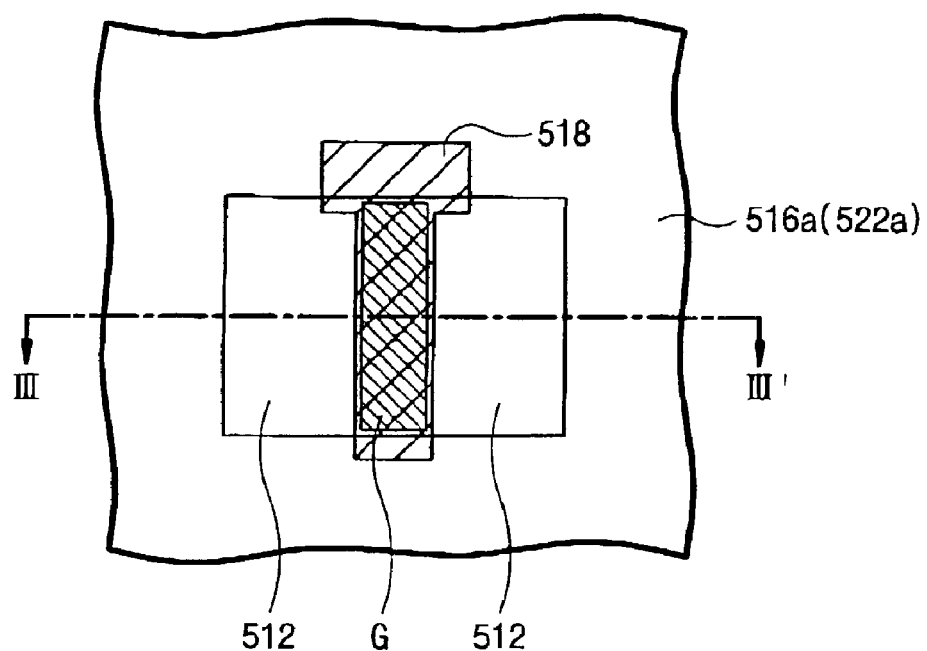
FIG. 41 illustrates a schematic, top view of a MOS transistor according to the present invention.

The present invention may also be applied to a conventional MOS transistor fabricating process. FIG. 41 illustrates a schematic, top view of a MOS transistor according to the present invention.

Referring to FIG. 41, a device isolation film 516a (522a) arranged in a portion of a semiconductor substrate restricts an active region 512. A gate pattern (G) and a conductive film pattern 518 are deposited on the active region 512 in the stated order. The gate pattern (G) has a sidewall self-aligned to the device isolation film 516a (522a). Also, the conductive film pattern 518 is extended over the device isolation film 516a (522a).

FIGS. 42 to 45 illustrate cross-sectional views of a tenth embodiment of the present invention, taken along a direction III–III' of FIG. 41.

Figure 42:
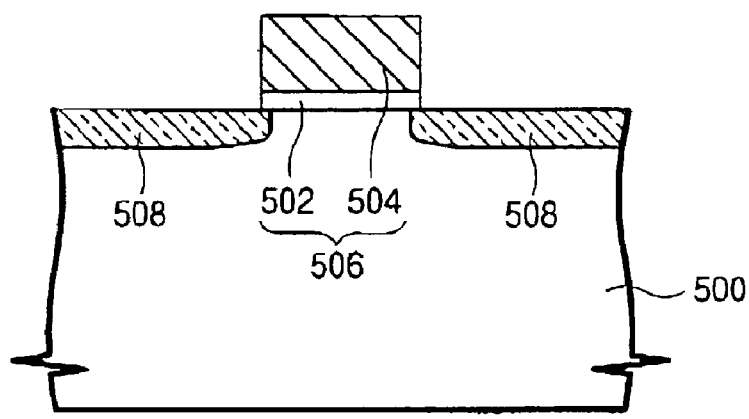
FIGS. 42 to 45 illustrate cross-sectional views of a semiconductor device according to a tenth embodiment of fabricating a semiconductor device according to the present invention, taken along a direction III–III' of FIG. 41.

Referring to FIG. 42, a gate line 506 is formed by a patterning process after a gate insulation film 502 and a gate conductive film 504 are formed on a semiconductor substrate 500 in the stated order. An impurity diffusion layer 508 is formed by injecting an impurity into the semiconductor substrate 500 on both sides of the gate line 506.

Figure 43:
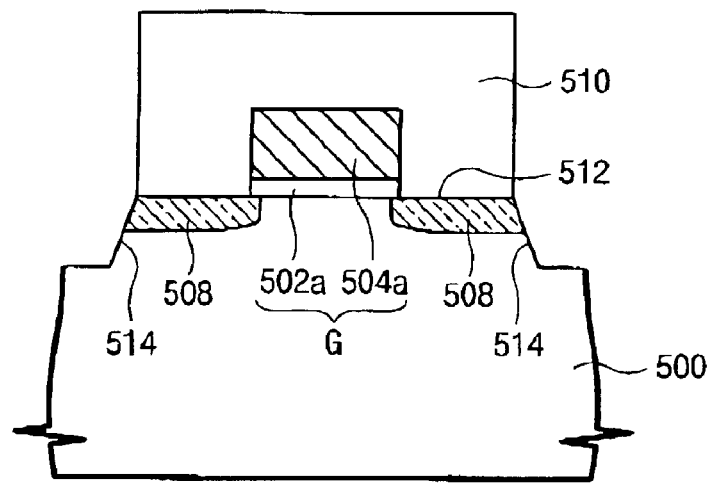

Referring to FIG. 43, after a photo-resist is formed over the entire surface of the semiconductor substrate 500, a photo-resist pattern 510 covering the gate line 506 and the impurity diffusion layer 508 across the gate line 506 is formed by a patterning process. A trench 514 restricting an active region 512 is formed by using the photo-resist pattern 510 as an etching mask and by patterning the gate line 506, impurity diffused region 508, and the semiconductor substrate 500, in the stated order. At the same time, a gate pattern (G) isolated by the trench 514 is formed on the active region, which is on the substrate 500. The gate pattern (G) is comprised of the gate line 506 isolated by the trench 514. Then, the photo-resist pattern 510 is eliminated.

Figure 44:
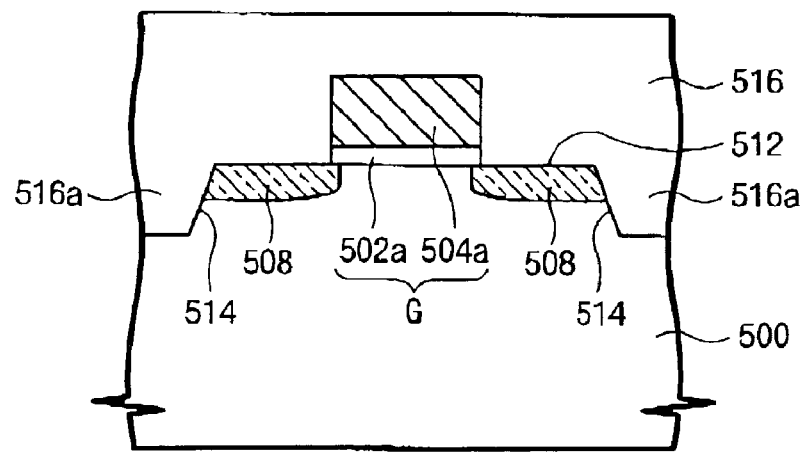

Referring to FIG. 44, an interlayer insulation film 516 filling the trench 514 is formed over the entire surface of the semiconductor substrate 500. The interlayer insulation film 516 in the trench 514 corresponds to a device isolation film 516a.

Figure 45:
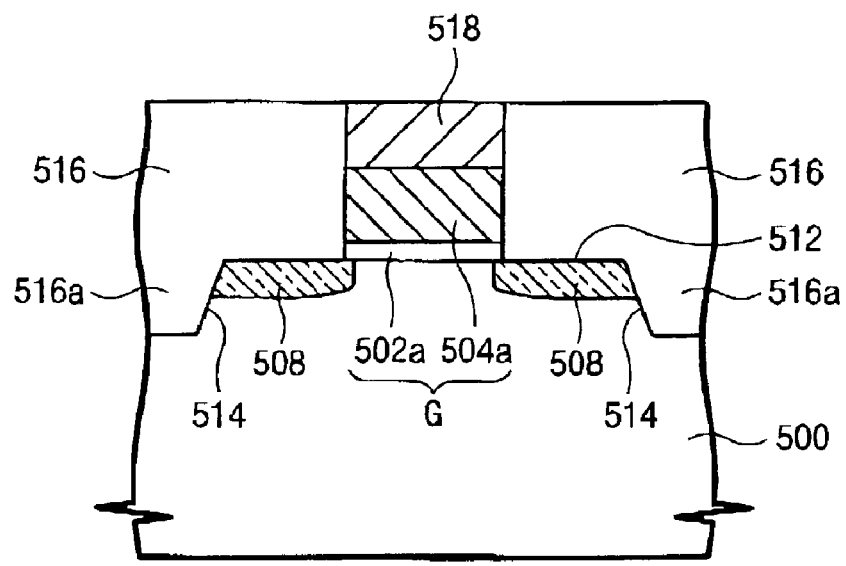

Referring to FIG. 45, a groove exposing the upper side of the gate pattern (G) and extended over the device isolation film 516a is formed by patterning the interlayer insulation film 516. Next, a conductive film pattern 518 is formed, by filling the groove with a conductive film. The conductive film pattern 518 comprises a gate electrode of the transistor.

Eleventh Embodiment

Figure 46:
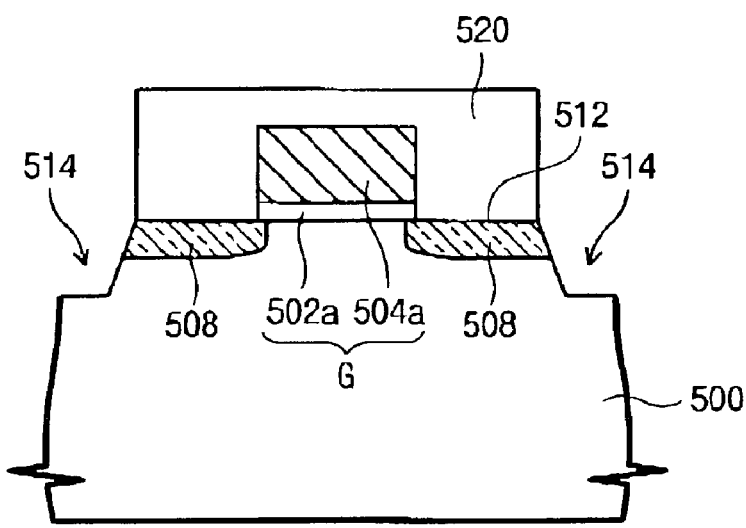
FIGS. 46 to 48 illustrate cross-sectional views of a semiconductor device according to an eleventh embodiment of fabricating a semiconductor device according to the present invention, taken along a direction III–III' of FIG. 41.
Figure 47:
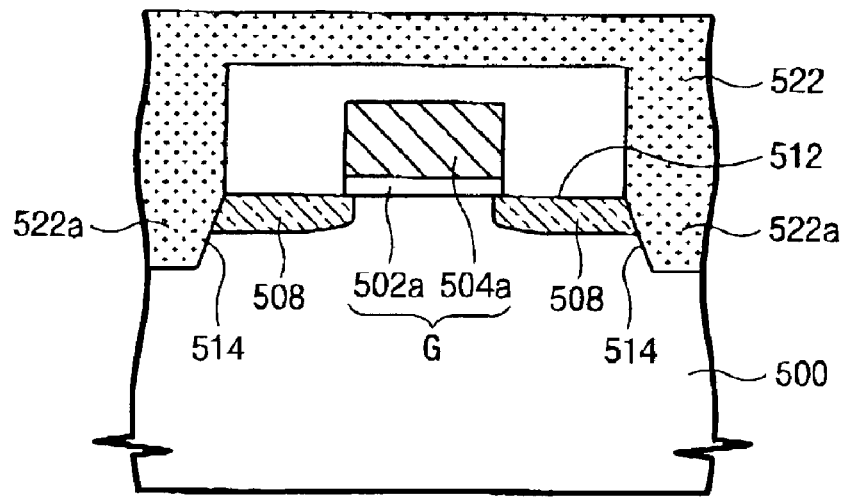
Figure 48:
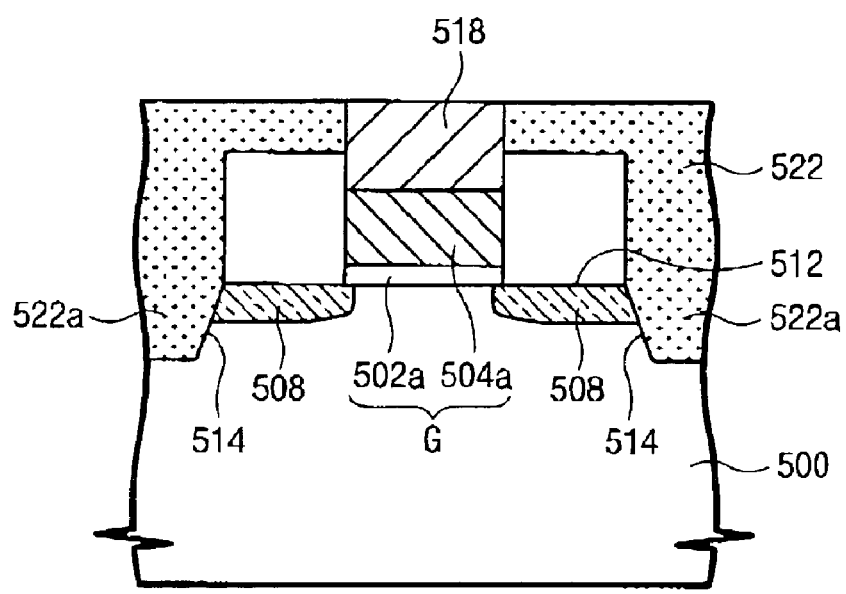

FIGS. 46 to 48 illustrate cross-sectional views of an eleventh embodiment of the present invention, taken along a direction III–III' of FIG. 41.

Referring to FIG. 46, as described above in connection with the tenth embodiment of the present invention shown in FIG. 42, a gate line 506 on a semiconductor substrate 500 and an impurity diffusion layer 508 on both sides of the gate line 506 and into the semiconductor substrate 500 are formed. Next, a first interlayer insulation film 520 covering the gate line 506 is formed, and a trench 514 restricting an active region 512 is formed, by patterning the first interlayer insulation film 520, the gate line 506, the impurity diffusion layer 508, and the semiconductor substrate 500 in the stated order. At the same time, a gate pattern (G) isolated by the trench 514 is also formed on the active region 512.

Referring to FIG. 47, a second interlayer insulation film 522 filling the trench 514 is formed over the entire surface of the semiconductor substrate 500. The second interlayer insulation film 522 corresponds to a device isolation film 522a. The subsequent process is similar to the process as described above in connection with the tenth embodiment of the present invention shown in FIG. 48, wherein a conductive film pattern 518 is formed on the gate line 506.

According to another embodiment of the present invention, the floating gate of a non-volatile memory device is not overlapped with the device isolation film, but self-aligned to the device isolation film. Therefore, the width of the device isolation film may be reduced and the area for cell array also may be reduced. Also, a uniform coupling ratio may be obtained because a uniform floating gate may be formed.

Furthermore, a floating trap type non-volatile memory device and a MOS transistor having a gate electrode self-aligned to a device isolation film may be fabricated.

Preferred embodiments of the present invention have been disclosed herein and, although specific terms are employed, they are used to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:
1. A semiconductor device, comprising:
   a device isolation film arranged on a portion of a semiconductor substrate and restricting an active region, wherein the substrate includes a trench region and the device isolation film is filled in the trench region;
   a word line crossing over the active region;
   a gate pattern including a floating gate pattern, a gate interlayer dielectric film pattern and a control gate electrode pattern in the stated order with the word line contacting the control gate electrode; and a tunnel oxide film disposed between the gate pattern and the active region, wherein:

the gate pattern is isolated by, and is self-aligned to the device isolation film so that the gate pattern and the device isolation film contact each other and the gate pattern is positioned between the word line and tunnel oxide film, a gate sidewall dielectric film and a sidewall spacer cover a sidewall of the gate pattern, and the control gate electrode pattern and the sidewall spacer are connected together to the word line, the sidewall spacer is a conductive film, and the sidewall spacer conductive film is a poly-silicon film.

2. The semiconductor device as claimed in claim 1, wherein the word line is formed of a polycide film or a metal film.

3. The semiconductor device as claimed in claim 1, wherein the word line is formed of a polycide film or a metal film including an interlayer metal film.

4. The semiconductor device as claimed in claim 1, wherein the tunnel oxide film is formed of a material selected from the group consisting of thermal silicon oxide and silicon oxynitride.

5. The semiconductor device as claimed in claim 1, further comprising an impurity diffusion layer in the active region outside of the word line.

6. The semiconductor device as claimed in claim 1, wherein the gate interlayer dielectric film pattern and the gate sidewall dielectric film are a silicon oxide-silicon nitride-silicon oxide (ONO) film.

7. The semiconductor device as claimed in claim 1, further comprising a blocking silicon oxide film in-between the sidewall spacer and the active region.

8. The semiconductor device as claimed in claim 1, further comprising an interlayer insulation film filling gaps outside of the word line.

9. The semiconductor device as claimed in claim 1, wherein the gate pattern includes a charge storage layer and a gate electrode, deposited in the stated order.

10. The semiconductor device as claimed in claim 1, wherein the device isolation film is formed of an insulation film.

11. The semiconductor device as claimed in claim 3, wherein the metal film is formed of a tungsten-based or a copper-based material.

12. The semiconductor device as claimed in claim 3, wherein the interlayer metal film is formed of a titanium (Ti) or a titanium nitride (TiN) material.

13. The semiconductor device as claimed in claim 8, wherein the interlayer insulation film is a low permittivity material.

14. The semiconductor device as claimed in claim 9, wherein the charge storage layer is formed of silicon oxide-silicon nitride-silicon oxide (ONO).

15. The semiconductor device as claimed in claim 13, wherein the low permittivity material is silicon oxide.

* * * * *